US010840478B2

(12) United States Patent
Han et al.

(10) Patent No.: US 10,840,478 B2
(45) Date of Patent: Nov. 17, 2020

(54) DISPLAY PANEL

(71) Applicant: SAMSUNG DISPLAY CO., LTD., Yongin-si (KR)

(72) Inventors: Seokkyu Han, Yongin-si (KR); Younggil Park, Yongin-si (KR); Kihyun Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 18 days.

(21) Appl. No.: 16/374,040

(22) Filed: Apr. 3, 2019

(65) Prior Publication Data

US 2020/0106045 A1 Apr. 2, 2020

(30) Foreign Application Priority Data

Sep. 28, 2018 (KR) .................. 10-2018-0116588

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3246* (2013.01); *H01L 27/3262* (2013.01); *H01L 27/3265* (2013.01); *H01L 27/3276* (2013.01); *H01L 27/124* (2013.01); *H01L 27/1218* (2013.01); *H01L 27/1255* (2013.01); *H01L 27/323* (2013.01); *H01L 29/167* (2013.01); *H01L 29/18* (2013.01); *H01L 51/0035* (2013.01); *H01L 51/0037* (2013.01); *H01L 51/0097* (2013.01); *H01L 51/5056* (2013.01); *H01L 51/5088* (2013.01); *H01L 51/56* (2013.01); *H01L 2227/323* (2013.01); *H01L 2251/301* (2013.01); *H01L 2251/303* (2013.01); *H01L 2251/5338* (2013.01)

(58) Field of Classification Search
CPC ............ H01L 27/2346; H01L 27/3265; H01L 27/1218; H01L 27/3276; H01L 27/6262; H01L 51/5253; H01L 51/0097; H01L 51/5221; H01L 51/5206; H01L 51/5012
See application file for complete search history.

(56) References Cited

U.S. PATENT DOCUMENTS 7,754,602 B2 7/2010 Jeon
9,245,938 B2 1/2016 Ohara et al.
(Continued)

FOREIGN PATENT DOCUMENTS

JP 2015103467 A 6/2015
JP 201639078 A 3/2016
(Continued)

*Primary Examiner* — Cuong Q Nguyen
(74) *Attorney, Agent, or Firm* — Cantor Colburn LLP

(57) ABSTRACT

A display panel includes a substrate including an opening area and a display area surrounding the opening area, a plurality of display elements in the display area, and a groove arranged between the opening area and the display area, and including a first protruding tip and a second protruding tip having different heights from an upper surface of the substrate and spaced apart from each other, where the first protruding tip and the second protruding tip protrude from a side of the groove toward an inside of the groove.

20 Claims, 14 Drawing Sheets

(51) Int. Cl.
   *H01L 51/00*      (2006.01)
   *H01L 27/12*      (2006.01)
   *H01L 51/56*      (2006.01)
   *H01L 29/167*     (2006.01)
   *H01L 29/18*      (2006.01)
   *H01L 51/50*      (2006.01)

(56) References Cited

U.S. PATENT DOCUMENTS

| | | |
|---|---|---|
| 9,673,419 B2 | 6/2017 | Ohara |
| 9,806,285 B2 | 10/2017 | Lee |
| 2007/0009652 A1 | 1/2007 | Manz et al. |
| 2017/0084631 A1* | 3/2017 | Kim .................... H01L 27/1248 |
| 2017/0271617 A1* | 9/2017 | Choi .................... H01L 51/0097 |
| 2019/0074478 A1* | 3/2019 | Kwon ................ H01L 51/0097 |

FOREIGN PATENT DOCUMENTS

| | | |
|---|---|---|
| KR | 100831250 B1 | 5/2008 |
| KR | 1020150046645 A | 4/2015 |

\* cited by examiner

DISPLAY PANEL

This application claims priority to Korean Patent Application No. 10-2018-0116588, filed on Sep. 28, 2018, and all the benefits accruing therefrom under 35 U.S.C. § 119, the content of which in its entirety is herein incorporated by reference.

BACKGROUND

1. Field

Exemplary embodiments relate to a display panel and more particularly, to a display apparatus including the display panel.

2. Description of the Related Art

Recently, purposes of a display apparatus have become various. In addition, as a thickness and a weight of the display apparatus have been decreasing, there is a tendency that the display apparatus is being more widely used.

As a size of a display area of the display apparatus is expanded, various functions in combination or abilities to link with the display apparatus are added. As the size of the display area is expanded, a plan for adding various functions to the display apparatus is being developed.

SUMMARY

As a detailed plan, in a case of a display apparatus including an area of an opening, a foreign substance like moisture, etc., may penetrate into a side of the opening. In this case, display elements surrounding at least a part of the opening may be damaged.

Exemplary embodiments include a display panel for preventing moisture penetration and a display apparatus including the display panel to solve several problems including the problems described above. However, the one or more embodiments are only examples, and the scope of the invention is not limited thereto.

Additional exemplary embodiments will be set forth in part in the description which follows and, in part, will be apparent from the description, or may be learned by practice of the presented embodiments.

In exemplary embodiments, a display panel includes a substrate including an opening area and a display area surrounding the opening area, a plurality of display elements in the display area, and a groove arranged between the opening area and the display area and including a first protruding tip and a second protruding tip having different heights from an upper surface of the substrate and spaced apart from each other, where the first protruding tip and the second protruding tip protrude from a side of the groove toward inside of the groove.

In an exemplary embodiment, each of the first protruding tip and the second protruding tip may be consecutively arranged along the side of the groove.

In an exemplary embodiment, the display panel may further include inorganic layers including a plurality of first inorganic material layers, and a plurality of second inorganic material layers arranged between the plurality of first inorganic material layers and having an etching rate greater than that of the plurality of first inorganic material layers, and the groove may be concave in a direction of a thickness of the inorganic layers.

In an exemplary embodiment, the first protruding tip and the second protruding tip may include the plurality of first inorganic material layers.

In an exemplary embodiment, the plurality of first inorganic materials may include silicon nitride (SiNx), and the plurality of second inorganic material layers may include silicon oxide (SiOx).

In an exemplary embodiment, the display panel may further include a thin-film transistor arranged in the display area and including a semiconductor layer, a gate electrode, a source electrode, and a drain electrode, and a first insulating interlayer, a first layer of a second insulating interlayer, and a second layer of the second insulating interlayer that are sequentially arranged between the gate electrode and the source electrode, where the first protruding tip is a part of the second layer of the second insulating interlayer, and the second protruding tip is a part of the first insulating interlayer.

In an exemplary embodiment, the display panel may further include a storage capacitor including a first electrode in the display area and in a same layer as a layer of the gate electrode of the thin-film transistor, and a second electrode on the first insulating interlayer.

In an exemplary embodiment, a third protruding tip may be further arranged at the side of the groove and spaced apart from the first protruding tip and the second protruding tip.

In an exemplary embodiment, the substrate may include a first base layer, a first inorganic layer, a second base layer, and a second inorganic layer that are sequentially stacked, a bottom surface of the groove may be an upper surface of the second base layer, and the third protruding tip may be provided by extending a buffer layer on the second inorganic layer.

In an exemplary embodiment, the display panel may further include a thin-film encapsulation layer covering the plurality of display elements and including a first inorganic encapsulation layer, an organic encapsulation layer, and a second inorganic encapsulation layer that are sequentially stacked, where the organic encapsulation layer fills at least a part of the groove.

In an exemplary embodiment, the first inorganic encapsulation layer may contact the second inorganic encapsulation layer in an area between the opening area and the groove.

In an exemplary embodiment, a thickness of at least one of the first protruding tip and the second protruding tip may decrease in a direction toward the inside of the groove.

In an exemplary embodiment, the display panel may further include a buffer layer on the substrate, and a thin-film transistor on the buffer layer in the display area, where a bottom surface of the groove is an upper surface of the buffer layer.

In an exemplary embodiment, the display panel may further include an additional groove between the groove and the opening area, and a partition wall arranged between the groove and the additional groove and including an inorganic material.

In exemplary embodiments, a display panel includes a substrate in which an opening is defined, display elements in a display area surrounding at least a part of the opening, a thin-film encapsulation layer arranged on the display elements and including a first inorganic encapsulation layer, an organic encapsulation layer, and a second inorganic encapsulation layer, and a groove between the opening and the display area, where the groove is concave in a direction of a thickness of layers including a plurality of first inorganic material layers and a plurality of second inorganic material layers, and a plurality of protruding tips are arranged on a side of the groove and at heights different from each other.

In an exemplary embodiment, the plurality of first inorganic material layers may include silicon nitride (SiNx), the plurality of second inorganic material layers may include silicon oxide (SiOx), and the plurality of protruding tips may be parts of the plurality of first inorganic material layers.

In an exemplary embodiment, the display panel may further include a thin-film transistor arranged in the display area and including a semiconductor layer, a gate electrode, a source electrode, and a drain electrode, and a first insulating interlayer, a first layer of a second insulating interlayer, and a second layer of the second insulating interlayer that are sequentially arranged between the gate electrode and the source electrode, where a first protruding tip is a part of the second layer of the second insulating interlayer, and a second protruding tip is a part of the first insulating interlayer.

In an exemplary embodiment, a thickness of at least one of the plurality of protruding tips may decrease in a direction toward an inside of the groove.

In an exemplary embodiment, the display panel may further include a buffer layer on the substrate, and a thin-film transistor on the buffer layer in the display area, where a bottom surface of the groove is an upper surface of the buffer layer.

In an exemplary embodiment, the display panel may further include an additional groove between the groove and an opening area, and a partition wall arranged between the groove and the additional groove and including an organic material.

BRIEF DESCRIPTION OF THE DRAWINGS

These and/or other exemplary embodiments will become apparent and more readily appreciated from the following description of the exemplary embodiments, taken in conjunction with the accompanying drawings, in which.

DETAILED DESCRIPTION

Figure 1:
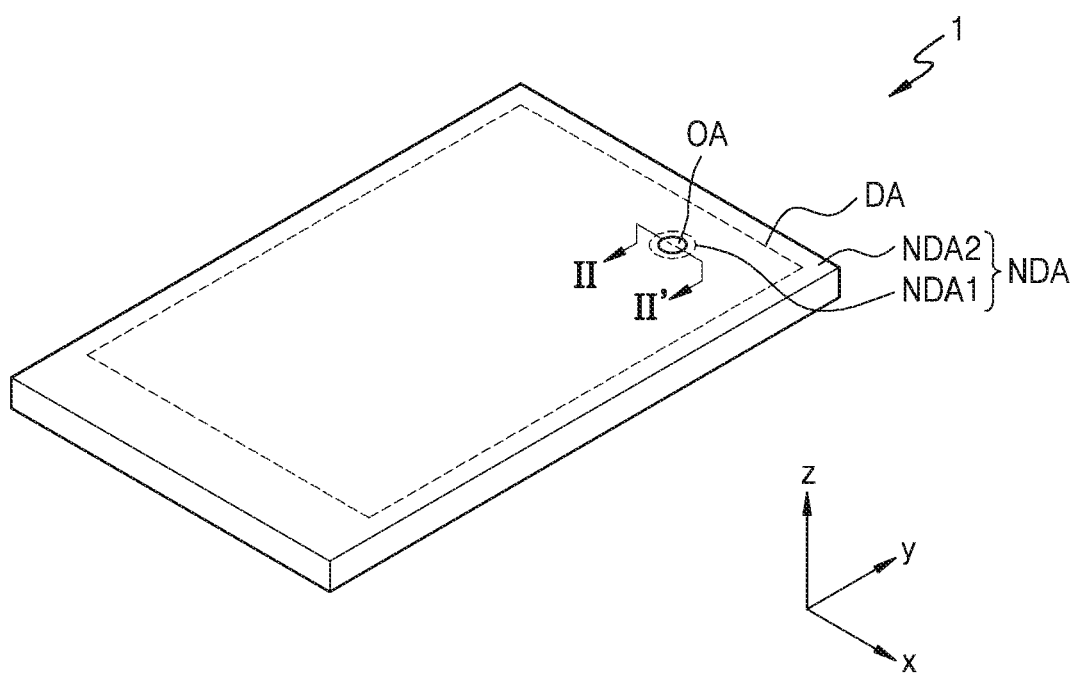
FIG. 1 is a perspective view of an exemplary embodiment of a display apparatus.

Reference will now be made in detail to embodiments, examples of which are illustrated in the accompanying drawings, where like reference numerals refer to like elements throughout. In this regard, the exemplary embodiments may have different forms and should not be construed as being limited to the descriptions set forth herein. Accordingly, the exemplary embodiments are merely described below, by referring to the drawing figures, to explain exemplary embodiments of the description. As used herein, the term "and/or" includes any and all combinations of one or more of the associated listed items. Expressions such as "at least one of," when preceding a list of elements, modify the entire list of elements and do not modify the individual elements of the list.

As the disclosure allows for various changes and numerous embodiments, particular embodiments will be illustrated in the drawings and described in detail in the written description. Effects and features of the disclosure and a method of achieving the same will become apparent to those skilled in the art from the following detailed description which discloses various embodiments in conjunction with the annexed drawings. The disclosure may, however, be embodied in many different forms and should not be construed as being limited to the exemplary embodiments set forth herein.

Hereinafter, embodiments will be described in detail with reference to the attached drawings. Like reference numerals in the drawings denote like elements, and thus their descriptions will not be repeated.

It will be understood that although the terms "first", "second", etc., may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "includes" and/or "including" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that when an element such as a layer or a region is referred to as being "connected to" or "coupled to" another element, it may be directly connected or coupled to the other element or indirectly connected or coupled to the other element with intervening elements therebetween. For example, when an element such as a layer or a region is referred to as being electrically "connected to" or "coupled to" another element, it may be electrically directly "connected or coupled" to the other element, or electrically indirectly "connected or coupled" to the other element with intervening elements therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a perspective view of an exemplary embodiment of a display apparatus 1.

Referring to FIG. 1, the display apparatus 1 includes a display area DA that emits light and a non-display area NDA that does not emit light. The display apparatus 1 may provide a predetermined image by light emitted from a plurality of pixels in the display area DA.

The display apparatus 1 includes an opening area OA, at least a part of which is surrounded by the display area DA. FIG. 1 shows that the whole opening area OA is surrounded by the display area DA. The non-display area NDA may include a first non-display area NDA1 surrounding the opening area OA, and a second non-display area NDA2 surrounding an outer edge of the display area DA. The first non-display area NDA1 may surround the whole opening area OA. The display area DA may surround the whole first non-display area NDA1. The second non-display area NDA2 may surround the whole display area DA.

Hereinafter, an organic light-emitting display apparatus is described as an example of the display apparatus 1 in an exemplary embodiment. However, the display apparatus 1 in the invention is not limited thereto. In another exemplary embodiment, various types of display apparatus such as an inorganic electroluminescent ("EL") display (inorganic light-emitting display) apparatus, a quantum dot light-emitting display apparatus, etc., may be used.

Figure 2A:
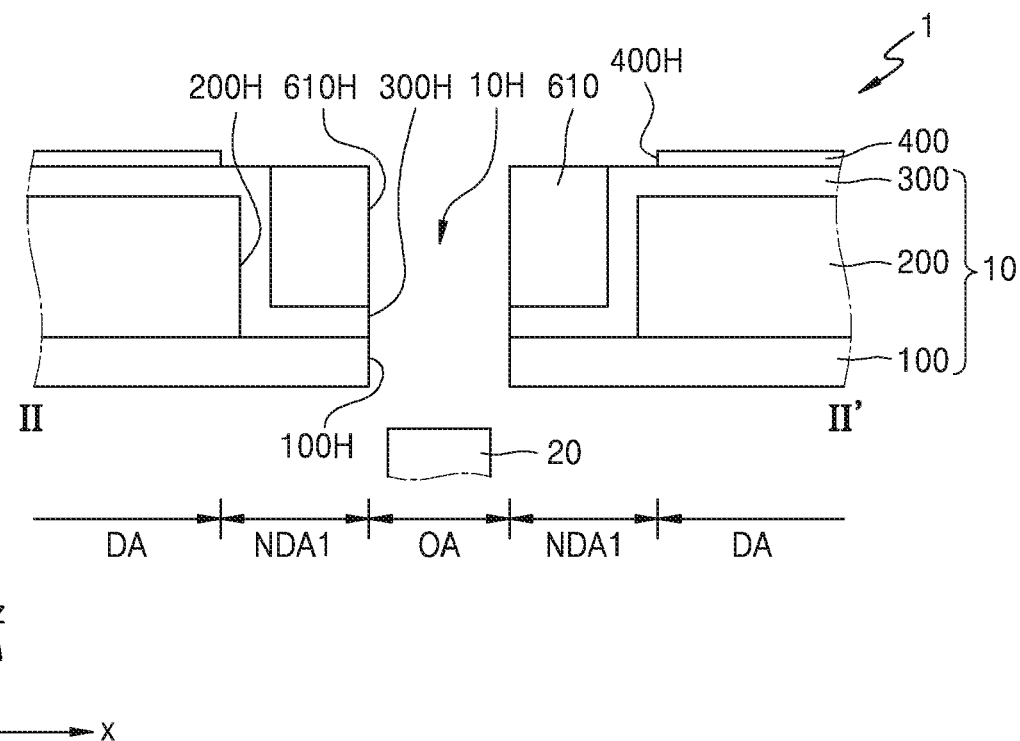
FIGS. 2A through 2C are brief cross-sectional views of an exemplary embodiment of a display apparatus.
Figure 2B:
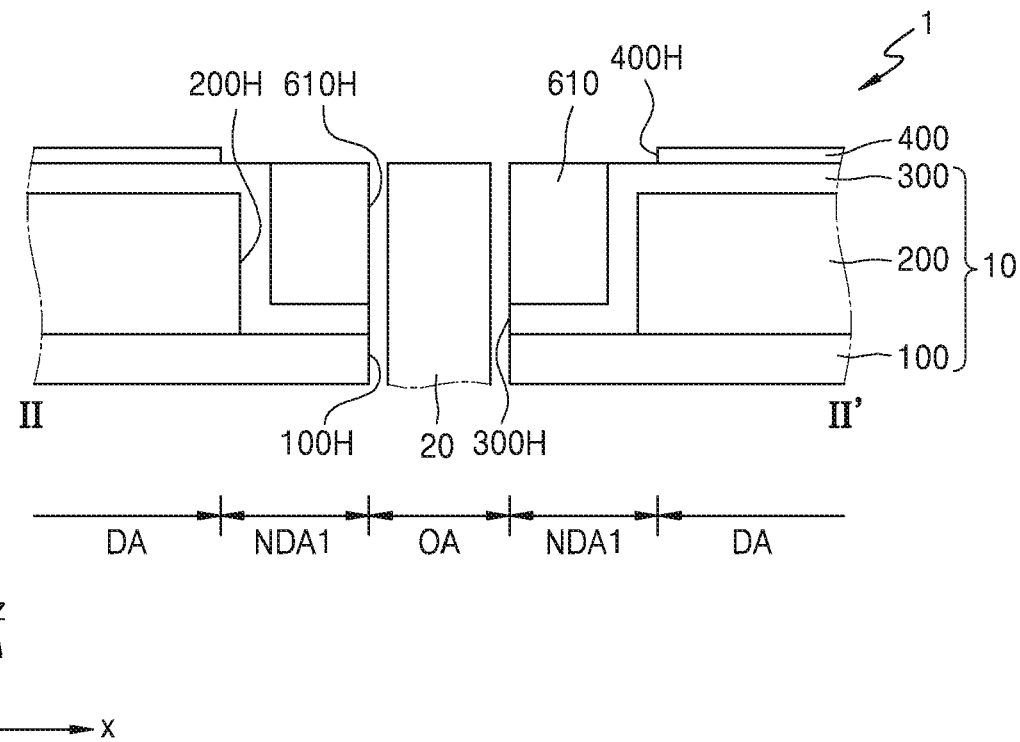
Figure 2C:
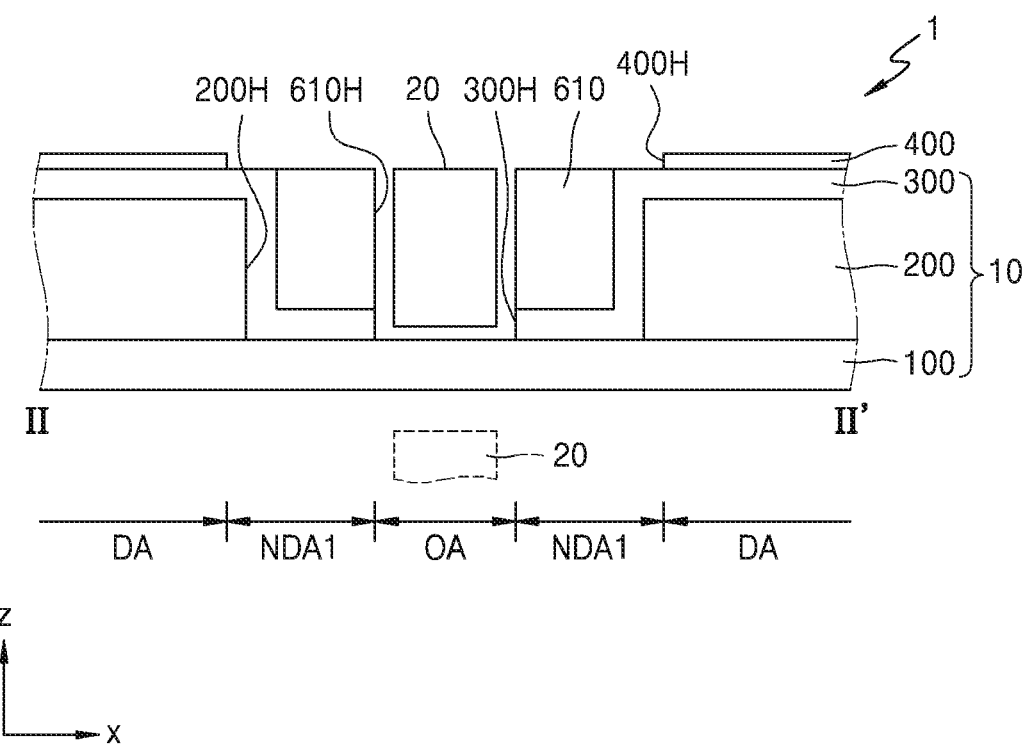

FIGS. 2A through 2C are schematic cross-sectional views of exemplary embodiments of the display apparatus 1, in correspondence with line II-II' of FIG. 1.

Referring to FIG. 2A, the display apparatus 1 may include a display panel 10, and a component 20 corresponding to the opening area OA of the display panel 10.

The display panel 10 may include a substrate 100, a display element layer 200 arranged on the substrate 100 and including display elements, a thin-film encapsulation layer 300 as an encapsulation member covering the display element layer 200, and an input detection layer 400 which detects a touch input. Although not illustrated, a component (or components) like a reflection prevention member including a polarizer, a retarder, a color filter, or a black matrix, or a transparent window may be further arranged on the input detection layer 400.

The substrate 100 may include a polymer resin. The substrate 100 including the polymer resin may ensure that the substrate 100 is flexible, compared to a glass substrate. In an exemplary embodiment, the substrate 100 may include a transparent polymer resin, for example. The substrate 100 is a barrier layer preventing penetration of an external foreign substance other than the above-described polymer resin. In an exemplary embodiment, the substrate 100 may further include a single inorganic layer or a plurality of inorganic layers including an inorganic material such as silicon nitride (SiNx) and/or silicon oxide (SiOx).

The display element layer 200 may include a display element in the display area DA, for example, an organic light-emitting diode. Although not illustrated, the display element layer 200 may include a thin-film transistor connected to the display element, a storage capacitor Cst, and wires.

The thin-film encapsulation layer 300 may prevent penetration of moisture or pollution substances from the outside into the display element layer 200, by covering the display element layer 200. The thin-film encapsulation layer 300 may include at least one inorganic encapsulation layer and at least one organic encapsulation layer. The thin-film encapsulation layer 300 may cover the display elements in the display area DA and extend to a non-display area NDA. In relation to this, FIG. 2A shows that the thin-film encapsulation layer 300 extends to the first non-display area NDA1.

The input detection layer 400 may be arranged in the display area DA. The input detection layer 400 may obtain coordinate information according to an external input, for example, a touch event. The input detection layer 400 may include a sensing electrode (or a touch electrode) and trace lines connected to the sensing electrode.

A process of forming the input detection layer 400 may be performed consecutively after a process of forming a planarization layer 610 that is to be described later or a process of forming the thin-film encapsulation layer 300 is performed. Accordingly, a bonding member may not be arranged between the input detection layer 400 and the thin-film encapsulation layer 300.

The planarization layer 610 is arranged in the first non-display area NDA1. The planarization layer 610 includes an organic insulating material. The planarization layer 610 may include a photoresist (e.g., a negative or positive photoresist), a material identical to that of the at least one organic encapsulation layer of the thin-film encapsulation layer 300, a material identical to that of an insulation layer of the input detection layer 400 that is to be described later, or other various types of organic insulation materials.

As shown in FIG. 2A, an opening 10H corresponding to the opening area OA and passing through the display panel 10 may be defined in the display panel 10. First to fourth openings 100H to 400H and a fifth opening 610H, each corresponding to the opening area OA, may be defined in the substrate 100, the display element layer 200, the thin-film encapsulation layer 300, the input detection layer 400, and the planarization layer 610. The first opening 100H may be arranged to pass through an upper surface and a lower surface of the substrate 100. The second opening 200H may be arranged to pass through lowest to uppermost layers of the display element layer 200. The third opening 300H may be arranged to pass through the thin-film encapsulation layer 300. The fourth opening 400H may be arranged to pass through lowest to uppermost layers of the input detection layer 400. The fifth opening 610H may be arranged to pass through an upper surface and a lower surface of the planarization layer 610.

The component 20 is arranged in the opening area OA. As shown in FIG. 2A, the component 20 may be arranged below the display panel 10 to correspond to the opening area OA. In an alternative exemplary embodiment, as shown in FIG. 2B, the opening area OA may be arranged in the opening 10H in the display panel 10 to overlap a side of the opening 10H of the display panel 10.

The component 20 may include an electronic element. In an exemplary embodiment, the component 20 may be an electronic element using light or sound, for example. In an exemplary embodiment, the electronic element may be a sensor receiving and using light like an infrared light sensor, a camera capturing an image by receiving light, a sensor measuring a distance or recognizing a fingerprint, etc., by outputting and detecting light or sound, or a small lamp outputting light or include a speaker outputting sound, etc., for example. In a case of the electronic element using light, light in various wavelength bands such as visible light, infrared light, ultraviolet light, etc., may be used. In some exemplary embodiments, the opening area OA may be understood as a transmission area into which light and/or sound is transmitted, where the light and/or sound are output from the component 20 to the outside or proceed from the outside to the electronic element.

In another exemplary embodiment, when the display panel 10 is used as a smart watch or a vehicle dashboard, the component 20 may be a member including a clock hand, a needle indicating predetermined information (e.g., a vehicle speed, etc.), or the like. As illustrated in FIG. 2A or 2B, the component 20 is a component that may be arranged in a position corresponding to the opening 10H of the display panel 10. As described above, the component 20 may include a component (or components) related to a function of the display panel 10 or a component like an accessory increasing a sense of beauty of the display panel 10.

As shown in FIGS. 2A and 2B, the first opening 100H corresponding to the opening area OA may be defined in the substrate 100. In an alternative exemplary embodiment, as shown in FIG. 2C, the first opening 100H may not be defined in the substrate 100. As shown by a dashed line, the component 20 may be arranged below the display panel 10. In an alternative exemplary embodiment, as shown by a solid line, the component 20 may be arranged in the opening 10H of the display panel 10. The component 20 arranged below the display panel 10 may be an electronic element using light. In this case, light transmittance may be about 50% or greater, about 70% or greater, about 75% or greater, about 80% or greater, about 85% or greater, or about 90% or greater.

As described with reference to FIGS. 2A to 2C, the first opening 100H may or may not be defined in the substrate 100. When the first opening 100H is defined in the substrate 100, the component 20 may be variously utilized without limitation to a type or location of the component 20.

Hereinafter, for convenience of description, the display panel 10 including the substrate 100 with the first opening 100H is described. However, characteristics to be described later may be also applied to the display panel 10 shown in FIG. 2C.

Figure 3:
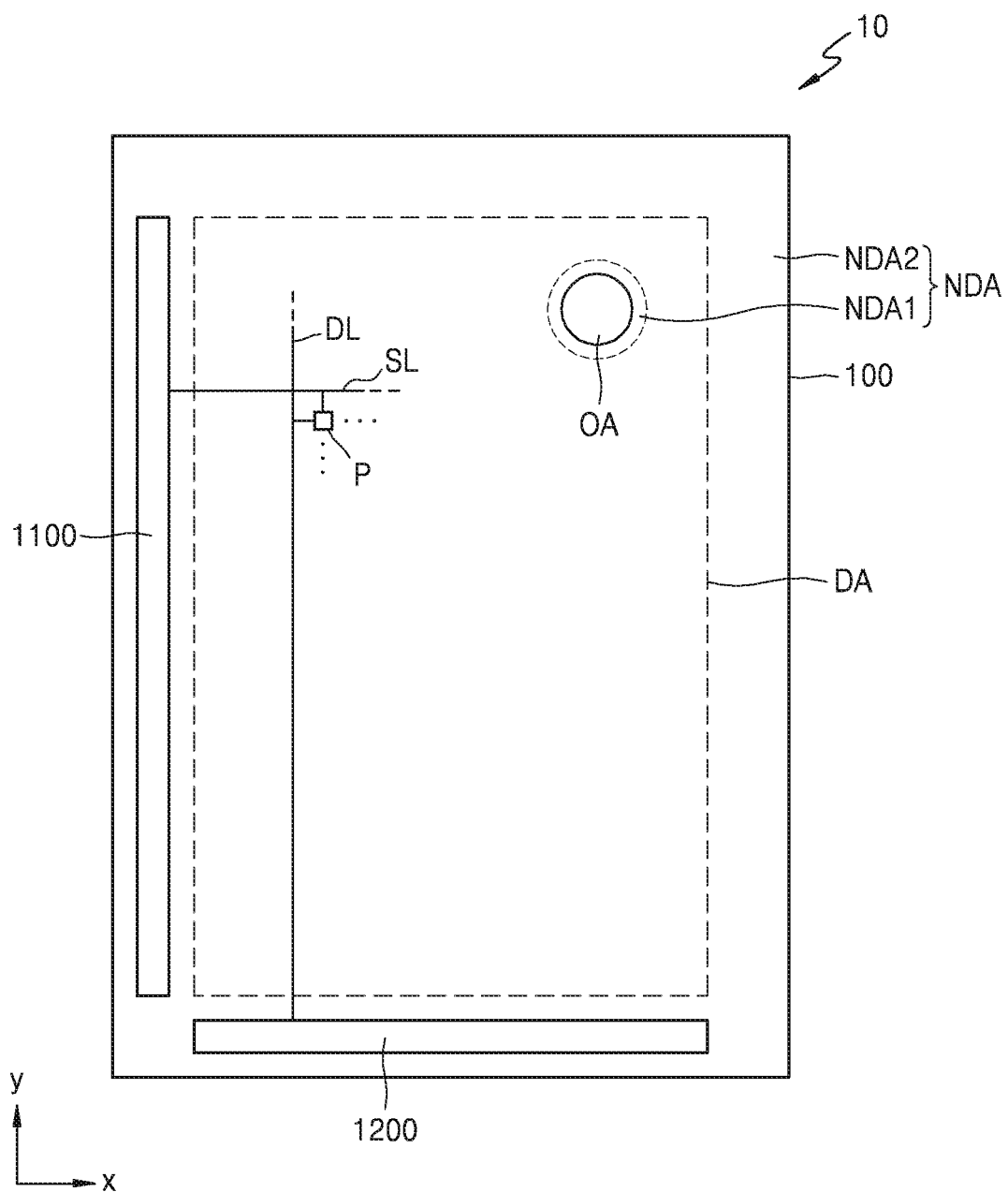
FIG. 3 is a plan view of an exemplary embodiment of the display panel.
Figure 4:
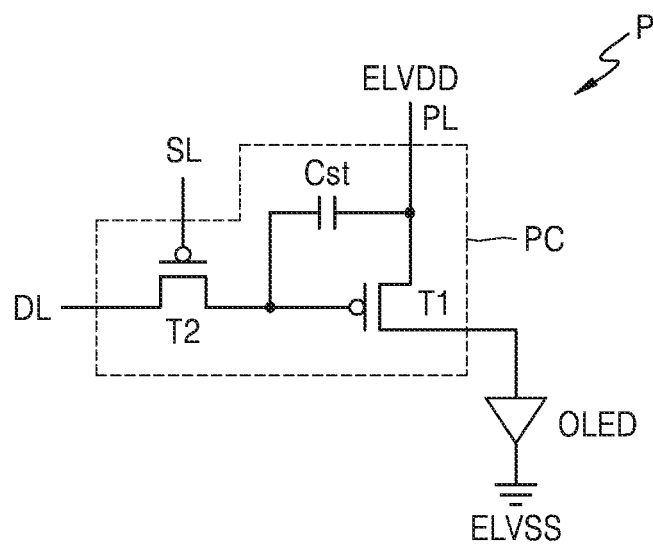
FIG. 4 is an equivalent circuit diagram of a pixel of the display panel.

FIG. 3 is a plan view of an exemplary embodiment of the display panel 10. FIG. 4 is an equivalent circuit diagram of a pixel of the display panel 10.

Referring to FIG. 3, the display panel 10 includes the display area DA and the first and second non-display areas NDA1 and NDA2. It may be understood that FIG. 3 shows a shape of the substrate 100 in the display panel 10. In an exemplary embodiment, it may be understood that the substrate 100 includes the opening area OA, the display area DA, and the first and second non-display areas NDA1 and NDA2, for example.

The display panel 10 includes a plurality of pixels P in the display area DA. Each of the plurality of pixels P may include a display element, for example, an organic light-emitting diode. Each of the plurality of pixels P may emit, for example, red, green, blue, or white light via the organic light-emitting diode.

Referring to FIG. 4, each of the plurality of pixels P includes a pixel circuit PC, and an organic light-emitting diode OLED connected to the pixel circuit PC. The pixel circuit PC may include a first thin-film transistor T1, a second thin-film transistor T2, and a storage capacitor Cst.

The second thin-film transistor T2 is a switching thin-film transistor, and connected to scan lines SL and data lines DL. According to a switching voltage input from the scan line SL, the second thin-film transistor T2 transmits a data voltage input from the data lines DL to the first thin-film transistor T1. The storage capacitor Cst is connected to the second thin-film transistor T2 and a driving voltage line PL, and stores a voltage corresponding to a difference between a voltage received from the second thin-film transistor T2 and a first power voltage ELVDD supplied to the driving voltage line PL.

The first thin-film transistor T1 is a driving thin-film transistor, and connected to the driving voltage line PL and the storage capacitor Cst. The first thin-film transistor T1 may control a driving current flowing from the driving voltage line PL to the organic light-emitting diode OLED in correspondence with a value of the voltage stored in the storage capacitor Cst. The organic light-emitting diode OLED may emit light having predetermined brightness according to the driving current. An opposite electrode (e.g., a cathode) of the organic light-emitting diode OLED may receive a second power voltage ELVSS.

It is described that the pixel circuit PC in FIG. 4 includes two thin-film transistors T1 and T2 and one storage capacitor Cst. However, the invention is not limited thereto. The number of thin-film transistors and the number of storage capacitors may be variously changed according to a design of the pixel circuit PC.

Referring back to FIG. 3, the first non-display area NDA1 may surround the opening area OA. The first non-display area NDA1 is an area in which the display element such as an organic light-emitting diode emitting light is not arranged. Wires like trace lines providing a signal to the plurality of pixels P in a periphery of the opening area OA may pass through the first non-display area NDA1 or a groove that is to be described later may be arranged in the first non-display area NDA1. In the second non-display area NDA2, a scan driver 1100 which provides a scan signal to each of the plurality of pixels P, a data driver 1200 which provides a data signal to each of the plurality of pixels P, a main power wire (not shown) which provides first and second power voltages ELVDD and ELVSS, etc., may be arranged. In an alternative exemplary embodiment, the data driver 1200 may be arranged on a flexible printed circuit board ("FPCB") connected to a pad included at a side of the display panel 10.

Figure 5:
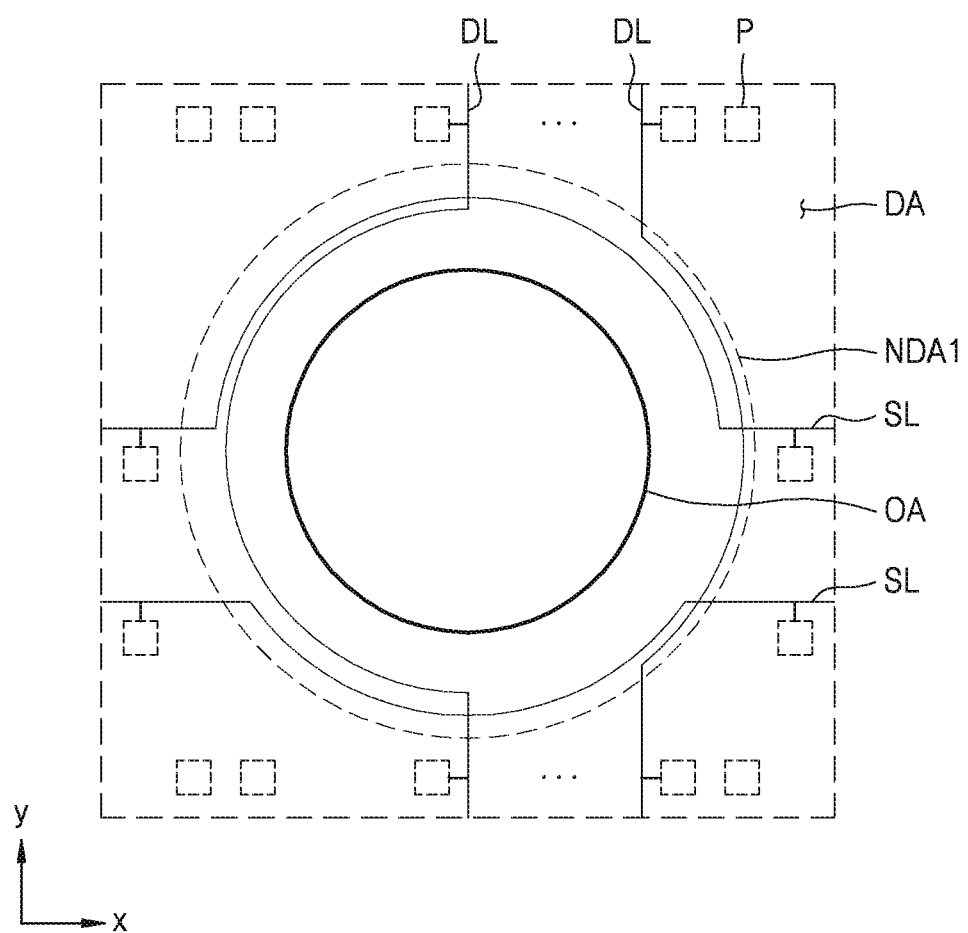
FIG. 5 is a plan view of an exemplary embodiment of wires (trace lines) arranged in an area of the display panel.

FIG. 5 is a plan view of an exemplary embodiment of a part of the display panel 10. FIG. 5 shows wires (e.g., trace lines) in the first non-display area NDA1.

Referring to FIG. 5, the plurality of pixels P is arranged around the opening area OA in the display area DA. The first non-display area NDA1 may be arranged between the opening area OA and the display area DA.

The plurality of pixels P may be arranged around the opening area OA to be separate from each other. The plurality of pixels P may be separate from each other above or below the opening area OA or at the left or right of the opening area OA with the opening area OA therebetween.

Trace lines adjacent to the opening area OA, among the trace lines providing a signal to the plurality of pixels P, may bypass the opening area OA. Among data lines DL passing through the display area DA, some data lines DL extend in a y-direction to provide a data signal to the plurality of pixels P arranged above or below the opening area OA with the opening area OA therebetween, and may bypass the opening area OA along an edge of the opening area OA in the first non-display area NDA1. Among the scan lines SL passing through the display area DA, some scan lines SL extend in an x-direction to provide a scan signal to the plurality of pixels P arranged at the left or right of the opening area OA with the opening area OA therebetween, and may bypass the opening area OA along an edge of the opening area OA in the first non-display area NDA1.

Figure 6:
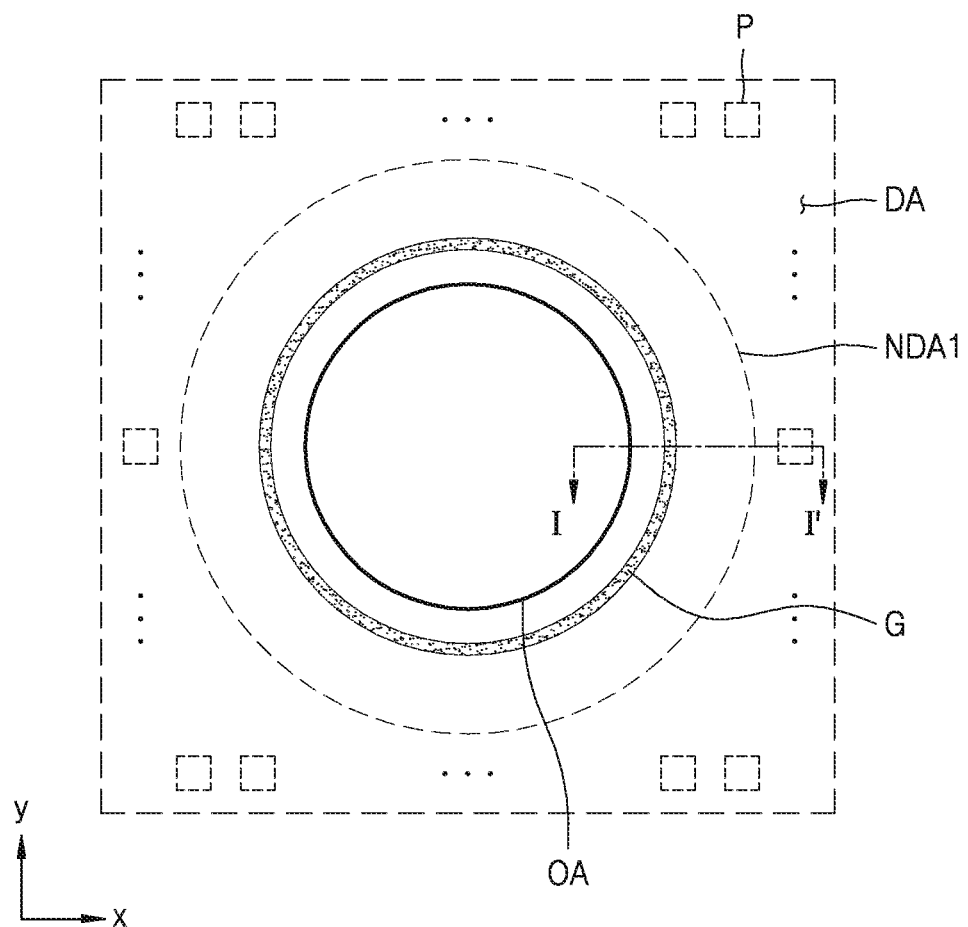
FIG. 6 is a plan view of an exemplary embodiment of a groove arranged in an area of the display panel.

FIG. 6 is a plan view of an exemplary embodiment of a part of the display panel 10. FIG. 6 shows a groove G in the first non-display area NDA1.

Referring to FIG. 6, in an exemplary embodiment, the groove G is arranged between the opening area OA and the display area DA of the display panel 10. The groove G may have a shape of a ring surrounding the whole opening area OA in the first non-display area NDA1. Accordingly, a diameter of the groove G may be greater than that of the opening area OA.

Referring to FIGS. 5 and 6, the groove G may be more adjacent to the opening area OA than a bypass area in which trace lines, for example, the data lines DL or the scan lines SL bypass along the edge of the opening area OA is to the opening area.

Figure 7:
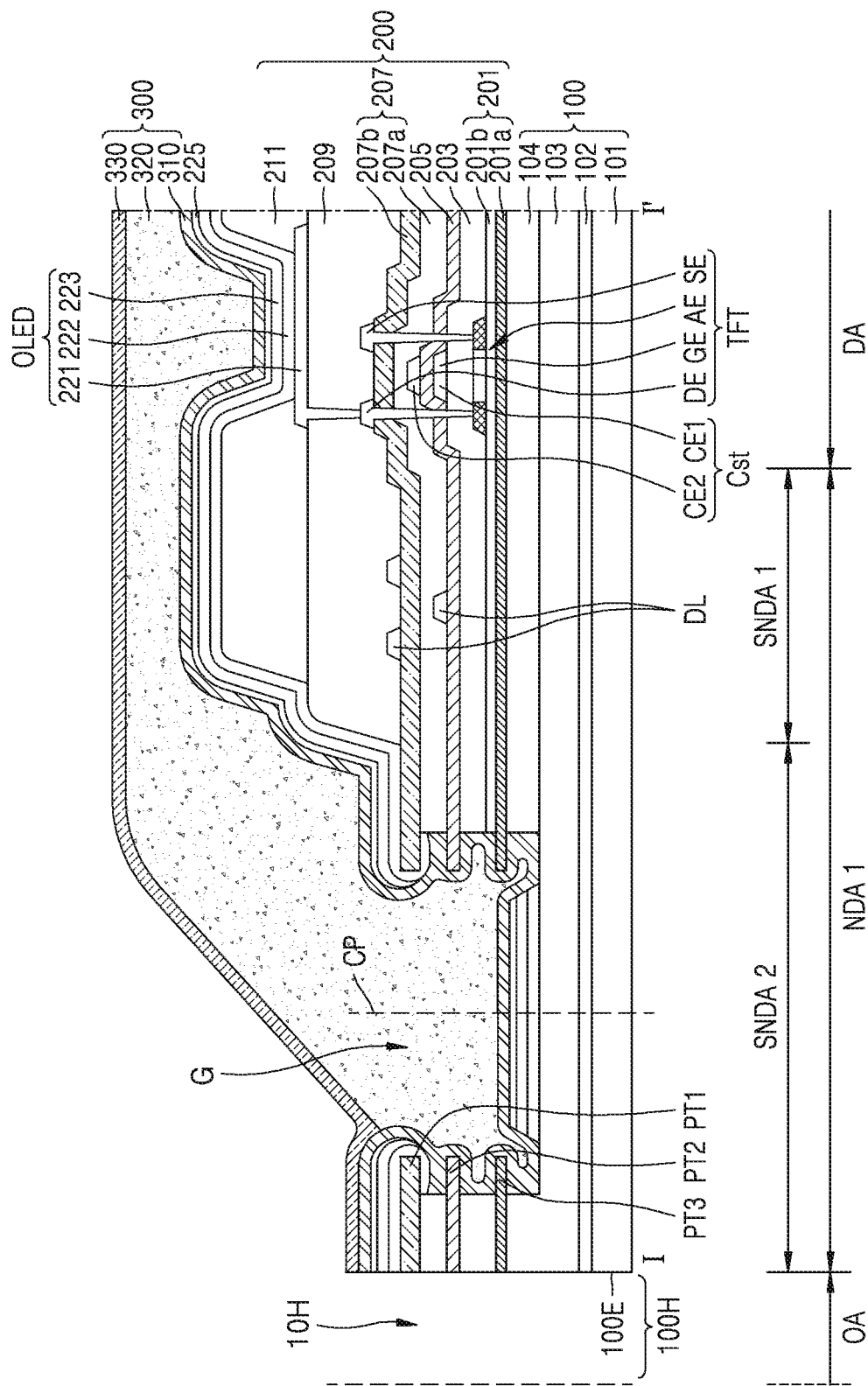
FIG. 7 is a cross-sectional view of an exemplary embodiment of the display panel, in correspondence with a line I-I' of FIG. 6.
Figure 8:
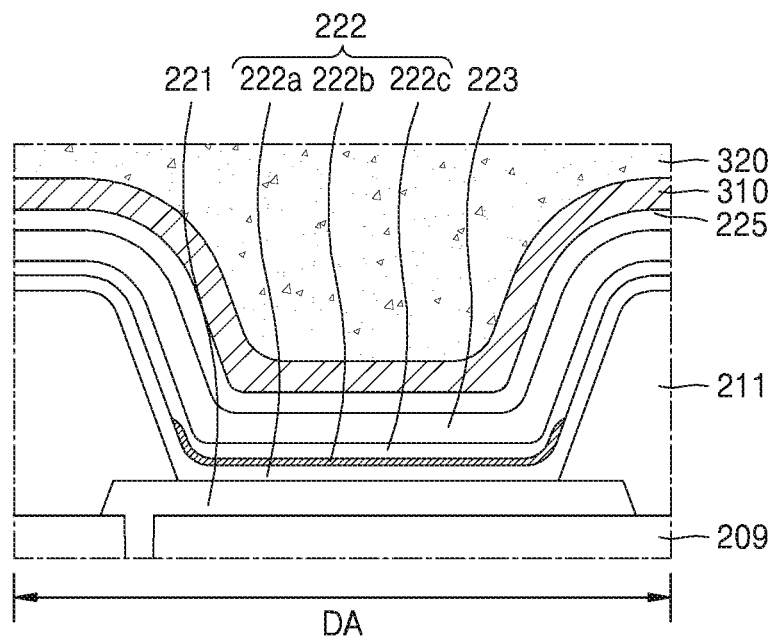
FIG. 8 is a cross-sectional view of an exemplary embodiment of a display device among parts of the display panel.
Figure 9:
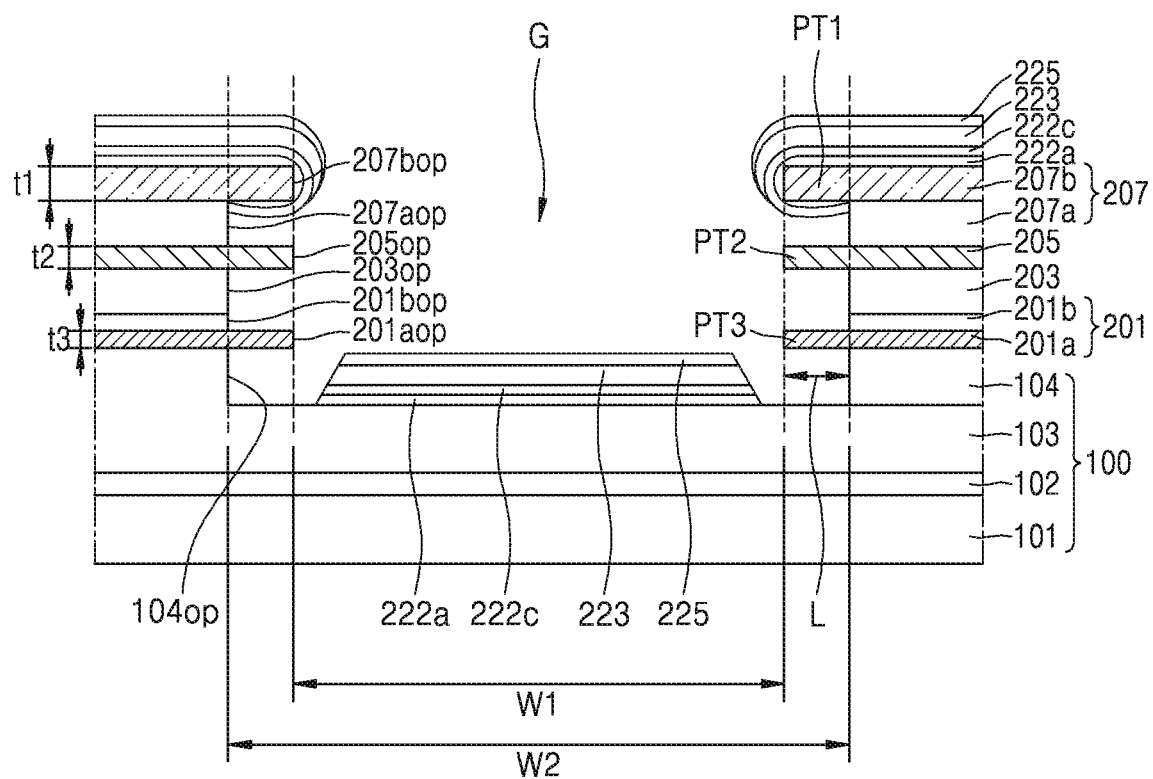
FIG. 9 is a cross-sectional view of an exemplary embodiment of a groove among parts of the display panel.

FIG. 7 is a cross-sectional view of an exemplary embodiment of the display panel 10, in correspondence with line I-I' of FIG. 6. FIG. 8 is an expanded cross-sectional view of the organic light-emitting diode OLED of FIG. 7. FIG. 9 is an expanded cross-sectional view of the groove G of FIG. 7. FIG. 7 shows the opening area OA, and the first non-display area NDA1 and the display area DA in a periphery of the opening area OA. The first opening 100H corresponding to the opening area OA may be defined in the substrate 100. Hereinafter, it may be understood that the opening area OA refers to the opening 10H of the display panel 10 or the first opening 100H of the substrate 100.

First, the display area DA of FIG. 7 is described.

The substrate 100 may include a polymer resin. The substrate 100 may include a base layer including a polymer resin, and an inorganic layer. In an exemplary embodiment, the substrate 100 may include a first base layer 101, a first inorganic layer 102, a second base layer 103, and a second inorganic layer 104 that are sequentially stacked, for example.

The first and second base layers 101 and 103 may each include a polymer resin. In an exemplary embodiment, the first and second base layers 101 and 103 may each include a polymer resin like polyethersulphone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), cellulose triacetate ("TAC"), cellulose acetate propionate ("CAP"), or the like, for example. The polymer resin may be transparent.

The first and second inorganic layers 102 and 104 are respective barrier layers preventing penetration of foreign substances. In an exemplary embodiment, the first and second inorganic layers 102 and 104 may include a single layer or multiple layers including an inorganic material like SiNx and/or SiOx.

A buffer layer 201 which prevents impurities from penetrating into a semiconductor layer of a thin-film transistor may be arranged on the substrate 100. In an exemplary embodiment, the buffer layer 201 may include an inorganic insulating material like SiNx or SiOx, and include a single layer or multiple layers. In some exemplary embodiments, the second inorganic layer 104 of the substrate 100 may be understood as a part of the buffer layer 201 having multiple layers.

In some exemplary embodiments, the buffer layer 201 may have a structure in which a first buffer layer 201a and a second buffer layer 201b including different materials are stacked. In an exemplary embodiment, the first buffer layer 201a may include SiNx, and the second buffer layer 201b may include SiOx, for example. In addition, a material of the first buffer layer 201a may be different from that of the second inorganic layer 104 arranged below the first buffer layer 201a.

That is, the first buffer layer 201a may be arranged between the second inorganic layer 104 and the second buffer layer 201b. A material of the first buffer layer 201a may be different from that of the second inorganic layer 104 and the second buffer layer 201b. In an exemplary embodiment, a material having an etching rate different from that of the second inorganic layer 104 and the second buffer layer 201b under a same condition may be selected as a material of the first buffer layer 201a, for example.

In some exemplary embodiments, the first buffer layer 201a may include SiNx, and the second inorganic layer 104 and the second buffer layer 201b may include SiOx, for example.

The pixel circuit PC (refer to FIG. 4) including the thin-film transistor TFT, the storage capacitor Cst, etc., may be arranged on the buffer layer 201. The thin-film transistor TFT may include a semiconductor layer AE, a gate electrode GE, a source electrode SE, and a drain electrode DE. The thin-film transistor TFT of FIG. 7 may correspond to a driving thin-film transistor TFT described with reference to FIG. 4. In the illustrated exemplary embodiment, a top-gate type thin-film transistor TFT in which the gate electrode GE is arranged over the semiconductor layer AE with the gate insulating layer 203 between the electrode GE and the semiconductor layer AE is shown. However, in another exemplary embodiment, the thin-film transistor TFT may be a bottom-gate type thin-film transistor.

The semiconductor layer AE may include polysilicon. In an alternative exemplary embodiment, the semiconductor layer AE may include amorphous silicon, an oxide semiconductor, an organic semiconductor, or the like. The gate electrode GE may include a low-resistance metal material. In an exemplary embodiment, the gate electrode GE may include a conductive material including molybdenum (Mo), aluminum (Al), copper (Cu), titanium (Ti), or the like, and include a single layer or multiple layers including the above-described material.

The gate insulating layer 203 is arranged between the semiconductor layer AE and the gate electrode GE. In an exemplary embodiment, the gate insulating layer 203 may include an inorganic material like silicon oxide, silicon nitride, silicon oxynitride, aluminum oxide, titanium oxide, tantalum oxide, hafnium oxide, etc. The gate insulating layer 203 may include a single layer or multiple layers including the above-described material.

The source electrode SE and the drain electrode DE may include a material having a good conductivity. In an exemplary embodiment, the source electrode SE and the drain electrode DE may include a conductive material including Mo, Al, Cu, Ti, etc., and include a single layer or multiple layers including the above-described material. In an exemplary embodiment, the source electrode SE and the drain electrode DE may include multiple layers including Ti/Al/Ti, for example.

The storage capacitor Cst includes a lower electrode CE1 and an upper electrode CE2 overlapping each other with a first insulating interlayer 205 therebetween. The storage capacitor Cst may overlap with the thin-film transistor TFT. In relation to this, FIG. 7 shows that the gate electrode GE of the thin-film transistor TFT is the lower electrode CE1 of the storage capacitor Cst. In another exemplary embodiment, the storage capacitor Cst may not overlap the thin-film transistor TFT. The storage capacitor Cst may be covered by a second insulating interlayer 207.

In an exemplary embodiment, the first and second insulating interlayers 205 and 207 may include an inorganic insulating material like silicon oxide, silicon nitride, silicon oxynitride, aluminum oxide, titanium oxide, tantalum oxide, hafnium oxide, etc. The first and second insulating interlayers 205 and 207 may include a single layer or multiple layers including the above-described materials.

In some exemplary embodiments, the second insulating interlayer 207 may have a structure in which a first layer 207a and a second layer 207b are stacked. The first layer 207a may be arranged between the first insulating interlayer 205 and the second layer 207b and include a material different from that of the first insulating interlayer 205 and the second layer 207b. In an exemplary embodiment, the first layer 207a may include a material having an etching rate different from that of the first insulating interlayer 205 and the second layer 207b, for example.

In some exemplary embodiments, the first layer 207a may include SiOx, and the first insulating interlayer 205 and the second layer 207b may include SiNx, for example.

The pixel circuit PC including the thin-film transistor TFT and the storage capacitor Cst is covered by an organic insulating layer 209. The organic insulating layer 209 may be a planarization insulating layer. In an exemplary embodiment, the organic insulating layer 209 may include an organic insulating material like a general-use polymer such as polymethyl methacrylate ("PMMA") or polystyrene ("PS"), a polymer derivative including a phenol-based group, an acrylic-based polymer, an imide-based polymer, an aryl ether-based polymer, an amide-based polymer, a fluorine-based polymer, a p-xylene-based polymer, a vinyl alcohol-based polymer, or a blend thereof, etc. In an exemplary embodiment, the organic insulating layer 209 may include polyimide, for example.

The organic light-emitting diode OLED is arranged on the organic insulating layer 209. A pixel electrode 221 of the organic light-emitting diode OLED may be arranged on the organic insulating layer 209 and connected to the pixel circuit PC via a contact hole of the organic insulating layer 209.

In an exemplary embodiment, the pixel electrode 221 may include conductive oxide like indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another exemplary embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a combination thereof. In another exemplary embodiment, the pixel electrode 221 may further include a layer including ITO, IZO, ZnO, or $In_2O_3$ over/below the above-described reflective layer.

An opening exposing an upper surface of the pixel electrode 221 is defined in pixel-defining layer 211 which covers an edge of the pixel electrode 221. The pixel-defining layer 211 may include an organic insulating material. In an alternative exemplary embodiment, the pixel-defining layer 211 may include an inorganic insulating material, or organic and inorganic materials.

An intermediate layer 222 includes a light-emitting layer. The light-emitting layer may include a polymer organic material or a low-molecular weight organic material emitting light having a predetermined color. In an exemplary embodiment, as shown in FIG. 8, the intermediate layer 222 may include a first functional layer 222a below a light-emitting layer 222b and/or a second functional layer 222c above the light-emitting layer 222b.

The first functional layer 222a may include a single layer or multiple layers. In an exemplary embodiment, when the first functional layer 222a includes a polymer material, the first functional layer 222a may be a hole transport layer ("HTL") having a single-layered structure, and may include poly(3,4-ethylene dioxythiophene) ("PEDOT") or polyaniline ("PANI"), for example. When the first functional layer 222a includes a low-molecular weight organic material, the first functional layer 222a may include a hole injection layer ("HIL") and an HTL.

In another exemplary embodiment, the second functional layer 222c may be omitted. In an exemplary embodiment, when the first functional layer 222a and the light-emitting layer 222b include a polymer material, the second functional layer 222c may be provided to have excellent characteristics of the organic light-emitting diode OLED, for example. The second functional layer 222c may include a single layer or multiple layers. The second functional layer 222c may include an electron transport layer ("ETL") and/or an electron injection layer ("EIL").

Some of a plurality of layers constituting the intermediate layer 222, for example, a functional layer (or functional layers), may be arranged not only in the display area DA, but also in the first non-display area NDA1, and are disconnected in the first non-display area NDA1 by the groove G.

An opposite electrode 223 faces the pixel electrode 221 with the intermediate layer 222 therebetween. The opposite electrode 223 may include a conductive material having a low work function. In an exemplary embodiment, the opposite electrode 223 may include a (semi)transparent layer including Ag, Mg, Al, Pt, Pd, Au, Ni, Nd, Ir, Cr, lithium (Li), calcium (Ca), or an alloy thereof, etc. In an alternative exemplary embodiment, the opposite electrode 223 may further include a layer including ITO, IZO, ZnO, or $In_2O_3$ on the (semi)conductive layer including the above-described material.

A capping layer 225 may be arranged on the opposite electrode 223. The capping layer 225 may protect the organic light-emitting diode OLED and/or enhance the efficiency of light generated from the organic light-emitting diode OLED. The capping layer 225 may include a single layer and/or multiple layers including an organic material and/or an inorganic material. An inorganic barrier layer (not shown) including lithium-fluoride (LiF), etc., may be further arranged over the capping layer 225. The inorganic barrier layer may prevent or minimize damage to layers (e.g., the intermediate layer 222) below the inorganic barrier layer, where the damage may be caused by high energy of oxygen radicals generated in a process of forming a first inorganic encapsulation layer 310 that is to be described later, for example, a plasma chemical vapor deposition process.

The organic light-emitting diode OLED may be covered by the thin-film encapsulation layer 300 and protected from a foreign substance, moisture, or the like. The thin-film encapsulation layer 300 may include at least one organic encapsulation layer and at least one inorganic encapsulation layer. FIG. 7 shows that the thin-film encapsulation layer 300 includes first and second inorganic encapsulation layers 310 and 330 and an organic encapsulation layer 320 arranged therebetween. In another exemplary embodiment, the number of organic encapsulation layers, the number of inorganic encapsulation layers, and an order in which the organic encapsulation layers and the inorganic encapsulation layers are stacked may be changed.

In an exemplary embodiment, the first and second inorganic encapsulation layers 310 and 330 may include one or more inorganic insulating materials like aluminum oxide, titanium oxide, tantalum oxide, hafnium oxide, zinc oxide, silicon oxide, silicon nitride, or silicon oxynitride, and be provided by a chemical vapor deposition ("CVD") method, etc. The organic encapsulation layer 320 may include a polymer-based material. In an exemplary embodiment, the polymer-based material may include an acrylic-based resin, an epoxy-based resin, PI, polyethylene, etc.

The first non-display area NDA1 of FIG. 7 is described.

Referring to the first non-display area NDA1 of FIG. 7, the first non-display area NDA1 may include a first sub-non-display area SNDA1 located away from the opening area OA and a second sub-non-display area SNDA2 located near the opening area OA.

The first sub-non-display area SNDA1 is an area through which trace lines pass. The data lines DL of FIG. 7 may correspond to the data lines DL bypassing the opening area OA described with reference to FIG. 5. The first sub-non-display area SNDA1 may be a wiring area where the trace lines pass through or a bypass area where the trace lines bypass. As shown in FIG. 7, the data lines DL may be arranged alternately to have an insulating layer therebetween. In another exemplary embodiment, the data lines DL may be arranged on a same insulating layer. When neighboring data lines DL are respectively arranged over or below an insulating layer (e.g., the second insulating interlayer 207) with the insulating layer therebetween, a gap (pitch) between the neighboring data lines DL may be reduced and a width of the first non-display area NDA1 may be reduced. Although not illustrated, similarly to the data lines DL in the first sub-non-display area SNDA1 of FIG. 7, the scan lines SL (refer to FIG. 5) bypassing the opening area OA may be also arranged in the first sub-non-display area SNDA1.

The second sub-non-display area SNDA2 may be an area in which the groove G is arranged. The groove G may be defined in multiple layers including a plurality of inorganic layers.

The groove G may be defined by etching the second inorganic layer 104, the gate insulating layer 203, the first insulating interlayer 205, and/or the second insulating interlayer 207, etc. In relation to this, FIG. 7 shows that parts of the second inorganic layer 104, the buffer layer 201, the gate insulating layer 203, the first insulating interlayer 205, and the second insulating interlayer 207 are removed to thereby form the groove G.

A plurality of protruding tips may be provided at a side of the groove G. The plurality of protruding tips may protrude from a side of the groove G toward an inside of the groove G. In an alternative exemplary embodiment, the plurality of protruding tips may protrude from a side of the groove G toward a center line CP extending in a direction perpendicular to an upper surface of the substrate 100. Each of the plurality of protruding tips may have a shape of rings arranged consecutively along a side of the groove G.

Due to a structure of the groove G including the plurality of protruding tips, parts of the intermediate layer 222 (e.g., first and second functional layers 222a and 222c), the opposite electrode 223, and the capping layer 225 may be disconnected due to a structure of the groove G including the plurality of protruding tips.

FIGS. 7 and 9 show a case in which a first protruding tip PT1, a second protruding tip PT2, and a third protruding tip PT3 are arranged at a side of the groove G. Such a plurality of the protruding tips PT1 to PT3 may be provided by properly arranging materials having different etching rates under a same condition in a plurality of inorganic layers.

The first protruding tip PT1 is a protruding tip located in a top part of a side of the groove G. The first protruding tip PT1 may be provided as a part of the second layer 207b of the second insulating interlayer 207.

The second protruding tip PT2 is arranged below the first protruding tip PT1 to be separate from the first protruding tip PT1, and may be provided as a part of the first insulating interlayer 205.

The third protruding tip PT3 may arranged below the second protruding tip PT2 to be separate from the second protruding tip PT2, and may be provided as a part of the first buffer layer 201a.

The first to third protruding tips PT1 to PT3 may include a material having a small etching rate. An insulating layer between the first protruding tip PT1 and the second protruding tip PT2, an insulating layer between the second protruding tip PT2 and the third protruding tip PT3, and an insulating layer below the third protruding tip PT3 may include a material having a great etching rate.

In an exemplary embodiment, an etching rate of a material constituting the first to third protruding tips PT1 to PT3 may be ½ of an etching rate of a material arranged between the first to third protruding tips PT1 to PT3, for example.

Accordingly, an insulating layer forming the first to third protruding tips PT1 to PT3 is less etched compared to the insulating layers arranged between the first to third protruding tips PT1 to PT3, and resultantly, may have a shape protruding at a side of the groove G.

In some exemplary embodiments, the first to third protruding tips PT1 to PT3 may include SiNx, for example. In an exemplary embodiment, the insulating layers arranged between the first to third protruding tips PT1 to PT3 may include SiOx, for example.

In an exemplary embodiment, a length L for which the first to third protruding tips PT1 to PT3 protrude at the side of the groove G may be about 100 nanometers (nm) to about 600 nm, for example.

A thickness t1 of the first protruding tip PT1 may be greater than a thickness t2 of the second protruding tip PT2, and the thickness t2 of the second protruding tip PT2 may be greater than a thickness t3 of the third protruding tip PT3 (i.e., t1>t2>t3). In an exemplary embodiment, the thickness t1 of the first protruding tip PT1 may be about 2000 angstroms (Å), for example. In an exemplary embodiment, the thickness t2 of the second protruding tip PT2 may be about 1500 Å, for example. In an exemplary embodiment, the thickness of the third protruding tip PT3 may be about 500 Å, for example. The thicknesses t1, t2, and t3 of the first to third protruding tips PT1 to PT3 may have values derived by taking into account all characteristics of members in the display area DA, the thin-film transistor TFT, and the storage capacitor Cst.

In the illustrated exemplary embodiment, it may be understood that the groove G is concave in a direction of a thickness of multiple inorganic layers in which a plurality of first inorganic material layers and a plurality of second inorganic material layers, each having a different material or etching rate, are stacked.

In an alternative exemplary embodiment, since the plurality of inorganic material layers have a less etching rate than that of the plurality of second inorganic material layers, a width W1 of an opening defined by etching is less than a width W2 of an opening defined in the plurality of first inorganic layers. Thus, it may be understood that parts of the plurality of inorganic material layers become the first to third protruding tips PT1 to PT3.

The plurality of first inorganic material layers may include the first buffer layer 201a, the first insulating interlayer 205, and the second layer 207b of the second insulating interlayer 207. The plurality of second inorganic material layers may include the second inorganic layer 104, the second buffer layer 201b, the gate insulating layer 203, and the first layer 207a of the second insulating interlayer 207.

In correspondence with the groove G, openings 201aop, 205op, and 207bop passing through the first buffer layer 201a, the first insulating interlayer 205, and the second layer 207b of the second insulating interlayer 207 may be respectively defined in the first buffer layer 201a, the first insulating interlayer 205, and the second layer 207b of the second insulating interlayer 207.

In an alternative exemplary embodiment, openings 104op, 201bop, 203op, and 207aop respectively passing through the second inorganic layer 104, the second buffer layer 201b, the gate insulating layer 203, and the first layer 207a of the second insulating interlayer 207 may be respectively defined in the second inorganic layer 104, the second buffer layer 201b, the gate insulating layer 203, and the first layer 207a of the second insulating interlayer 207.

Widths W1 of the openings 201aop, 205op, and 207bop of the first buffer layer 201a, the first insulating interlayer 205, and the second layer 207b of the second insulating interlayer 207 may be less than widths W2 of the openings 104op, 201bop, 203op, and 207aop of the second inorganic layer 104, the second buffer layer 201b, the gate insulating layer 203, and the first layer 207a of the second insulating interlayer 207.

In the drawing, it is shown that the widths W1 of the openings 201aop, 205op, and 207bop of the first buffer layer 201a, the first insulating interlayer 205, and the second layer 207b of the second insulating interlayer 207 are same. However, the invention is not limited thereto. The widths W1 of the openings 201aop, 205op, and 207bop of the first buffer layer 201a, the first insulating interlayer 205, and the second layer 207b of the second insulating interlayer 207 may be different from each other.

The widths W2 of the openings 104op, 201bop, 203op, and 207aop of the second inorganic layer 104, the second buffer layer 201b, the gate insulating layer 203, and the first layer 207a of the second insulating interlayer 207 may also be different from each other.

Members including the parts of the intermediate layer 222 (e.g., the first and second functional layers 222a and 222c), the opposite electrode 223, and the capping layer 225 may surround parts of upper, side, and lower surfaces of the first protruding tip PT1. As the members including the parts of the intermediate layer 222 (e.g., the first and second functional layers 222a and 222c), the opposite electrode 223, and the capping layer 225 are stacked on the first protruding tip PT1, the members are less stacked on the second protruding tip PT2 and the third protruding tip PT3. Thus, the members may be disconnected.

As the members, that is, the parts of the intermediate layer 222 (e.g., the first and second functional layers 222a and 222c), the opposite electrode 223, and the capping layer 225 are disconnected, moisture and external air may be obstructed not to penetrate along the members.

The first inorganic encapsulation layer 310 of the thin-film encapsulation layer 300 may cover at least a part of an inner surface of the groove G. In the thin-film encapsulation layer 300, since the first inorganic encapsulation layer 310 has an excellent step coverage unlike the intermediate layer 222 and the opposite electrode 223, the first inorganic encapsulation layer 310 may have a connected form. In an exemplary embodiment, the first inorganic encapsulation layer 310 may cover the whole inner surface of the groove G, for example. However, the invention is not limited thereto. In some exemplary embodiments, the first inorganic encapsulation layer 310 may be disconnected in the groove G.

The organic encapsulation layer 320 may cover the groove G, and fill the groove G on the first inorganic encapsulation layer 310. The organic encapsulation layer 320 may be provided by spraying a monomer onto the substrate 100 and hardening the substrate 100. A partition wall (not shown) may be arranged adjacent to the opening area OA on the substrate 100 to control flow of the monomer and ensure a thickness of the monomer (or the organic encapsulation layer 320). An end of the organic encapsulation layer 320 may be spaced apart from the opening area OA or an end 100E of the substrate 100 by a predetermined distance.

The second inorganic encapsulation layer 330 is arranged on the organic encapsulation layer 320 and may directly contact the first inorganic encapsulation layer 310 in an area adjacent to the opening area OA, for example, an area between the opening area OA and the groove G.

Since the first inorganic encapsulation layer 310 directly contacts the second inorganic encapsulation layer 330, the organic encapsulation layer 320 is not exposed to the outside to thus obstruct a path of moisture penetration.

Figure 10A:
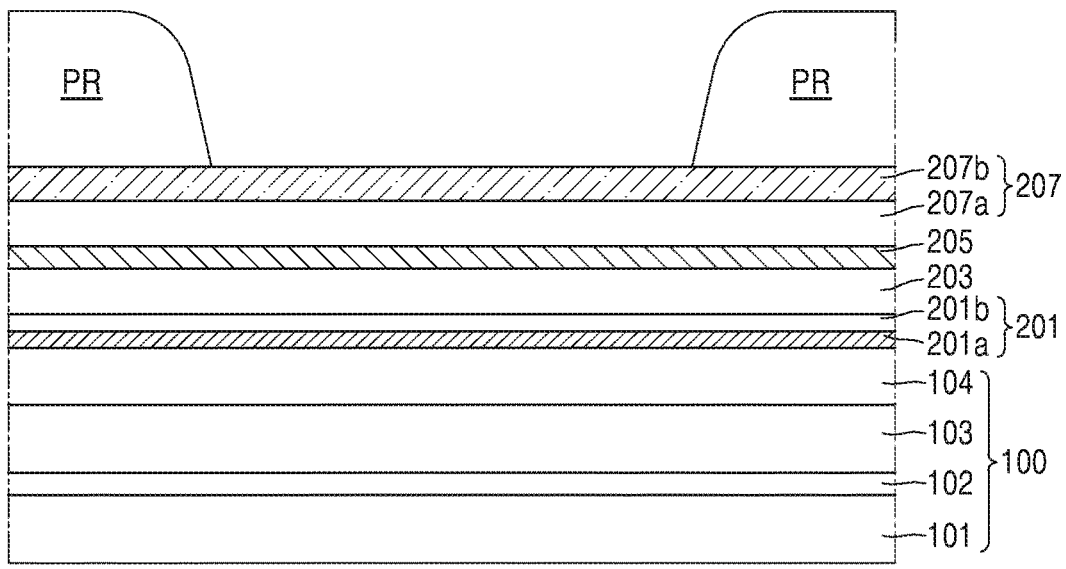
FIGS. 10A to 10C are cross-sectional views illustrating an exemplary embodiment of a method of manufacturing the display panel.
Figure 10B:
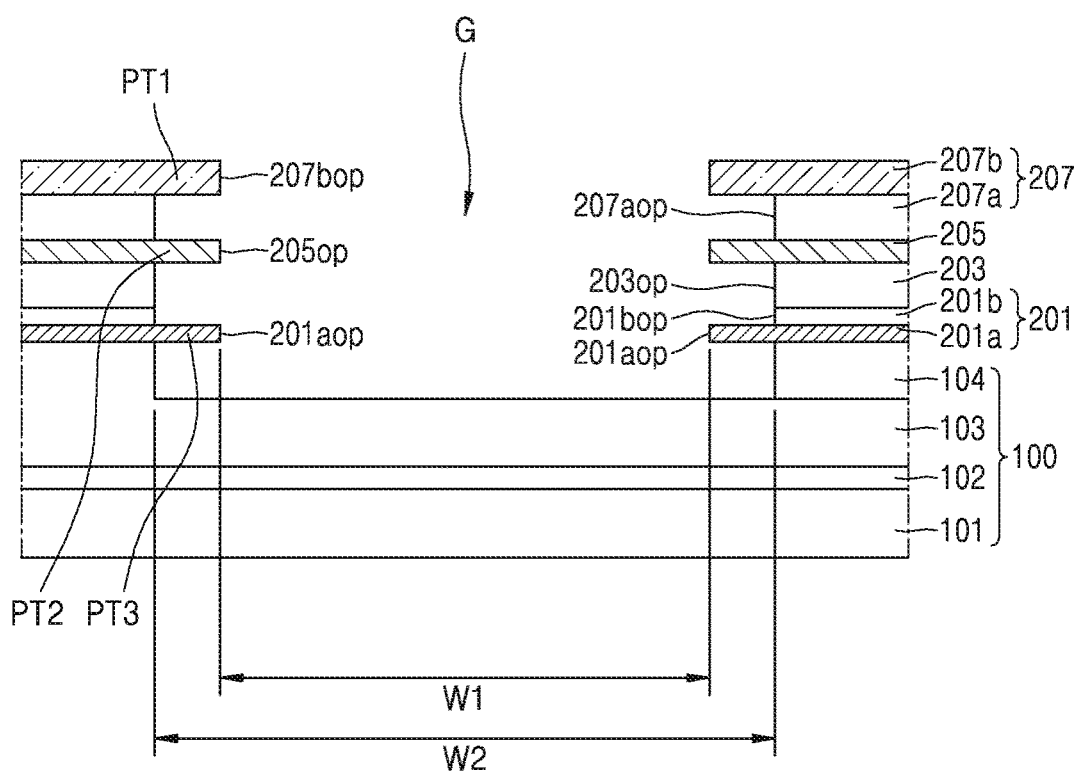
Figure 10C:
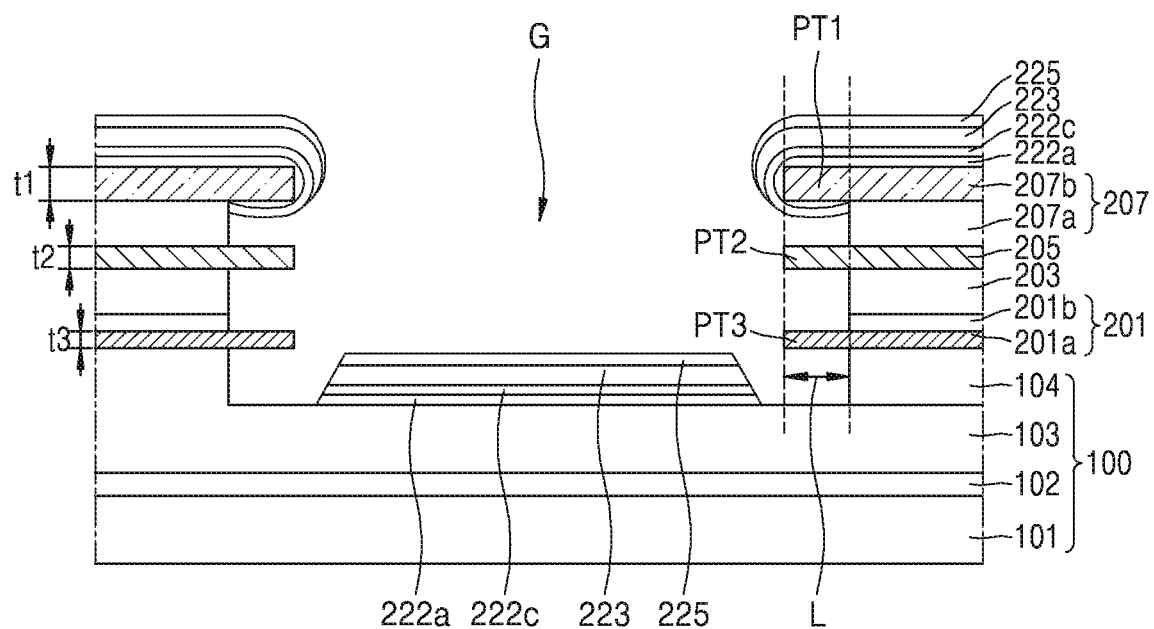

FIGS. 10A to 10C are schematic cross-sectional views illustrating a process of manufacturing the display panel 10 in an exemplary embodiment.

Referring to FIG. 10A, a pattern of a photoresist PR is provided to expose an area in which the groove G is to be defined. The area in which the groove G is to be defined may be an area in which a plurality of inorganic insulating layers are stacked on the substrate 100. In an exemplary embodiment, the second inorganic layer 104, the first buffer layer 201a, the second buffer layer 201b, the gate insulating layer 203, the first insulating interlayer 205, the first layer 207a of the second insulating interlayer 207, and the second layer 207b of the second insulating interlayer 207 on the substrate 100 may be sequentially stacked in the area in which the groove G is to be defined, for example.

The second inorganic layer 104, the second buffer layer 201b, the gate insulating layer 203, and the first layer 207a of the second insulating interlayer 207 may include a same material.

The first buffer layer 201a, the first insulating interlayer 205, and the second layer 207b of the second insulating interlayer 207 may include a same material.

Referring to FIG. 10B, the groove G is defined by performing etching. Materials having different etching rates may be stacked in an area in which the groove G is to be defined. Accordingly, the first to third protruding tips PT1, PT2, and PT3 may be provided by layers including a material having a low etching rate.

In some exemplary embodiments, etching may be dry etching using sulfur hexafluoride ($SF_6$) gas, for example. Since an etching rate of SiOx and SiNx to $SF_6$ gas is 2:1, the first to third protruding tips PT1 to PT3 may be provided by appropriately stacking SiOx and SiNx in inorganic layers in the area in which the groove G is to be defined.

In an exemplary embodiment, the second inorganic layer 104, the second buffer layer 201b, the gate insulating layer 203, and the first layer 207a of the second insulating interlayer 207 may include SiOx, for example. In addition, the first buffer layer 201a, the first insulating interlayer 205, and the second layer 207b of the second insulating interlayer 207 may include SiNx, for example.

Accordingly, the first protruding tip PT1 may be provided by the first buffer layer 201a, the second protruding tip PT2 may be provided by the first insulating interlayer 205, and the third protruding tip PT3 may be provided by the second layer 207b of the second insulating interlayer 207.

Thus, it may be understood that the widths W1 of the openings 201aop, 205op, and 207bop of the first buffer layer 201a, the first insulating interlayer 205, and the second layer 207b of the second insulating interlayer 207 may be less than the widths W2 of the openings 104op, 201bop, 203op, and 207aop of the second inorganic layer 104, the second buffer layer 201b, the gate insulating layer 203, and the first layer 207a of the second insulating interlayer 207.

The groove G is concave in a direction of a thickness of multiple layers including inorganic insulating layers, and a bottom surface of the groove G may be an upper surface of the second base layer 103 constituting the substrate 100.

As such, since an organic insulating layer is not etched in the groove G in the illustrated exemplary embodiment, an additional process of etching the organic insulating layer is not needed. Thus, a process may be simplified.

Referring to FIG. 10C, the groove G is defined, and then, the intermediate layer 222, the opposite electrode 223, and the capping layer 225 are provided.

The parts of the intermediate layer 222, for example, the first and second functional layers 222a and 222c, the opposite electrode 223, and the capping layer 225 may be provided as one body in the display area DA and the first non-display area NDA1. As shown in FIG. 10C, since the groove G includes the first to third protruding tips PT1 to PT3 protruding in direction toward the center line CP of the groove G, the parts of the intermediate layer 222, the opposite electrode 223, and the capping layer 225 are not connected.

Layers including an organic layer, among layers on the substrate 100, may be a path via which foreign substances such as moisture or oxygen penetrate. Since the first and second functional layers 222a and 222c and the capping layers 225 including an organic material are disconnected by to the groove G, a damage to the organic light-emitting diode OLED that may be caused when the moisture proceeds in a lateral direction may be prevented.

Figure 11:
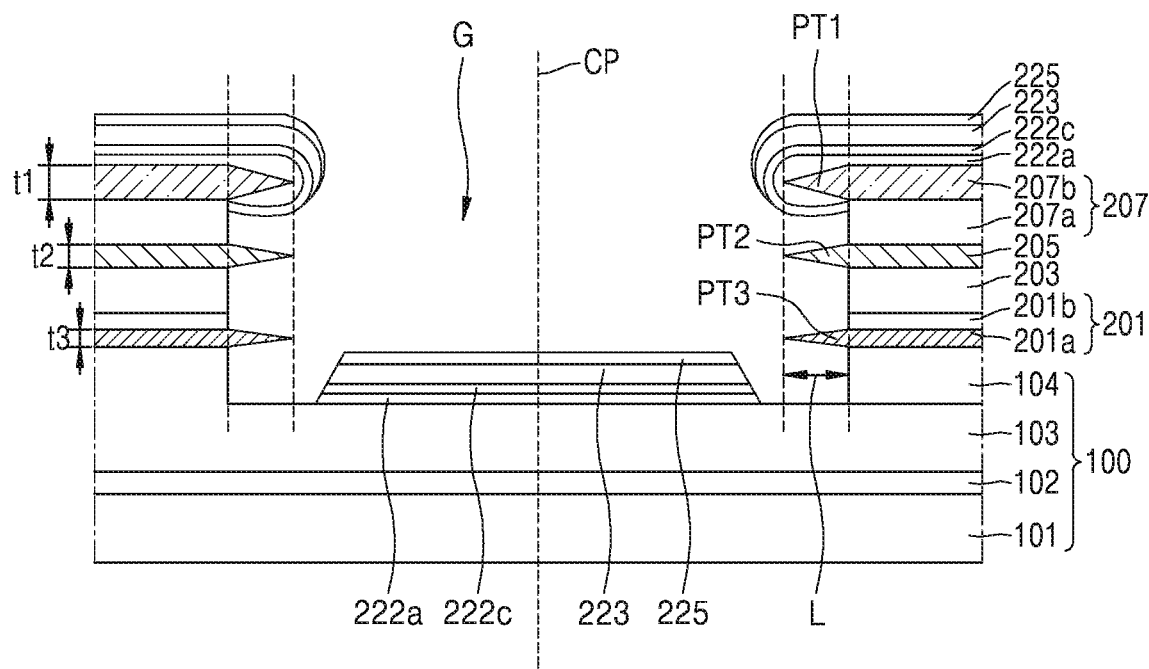
FIG. 11 is a cross-sectional view of another exemplary embodiment of a part of a display panel.

FIG. 11 is a cross-sectional view of another exemplary embodiment of a part of a display panel. FIG. 11 shows an area in which the groove G is arranged. Like numerals in FIGS. 9 and 11 denote like members, and thus, a description thereof will not be provided here again.

In the illustrated exemplary embodiment, the display panel includes the groove G between the opening area OA and the display area DA. The groove G includes the plurality of protruding tips PT1 to PT3 having different heights from an upper surface of the substrate 100 and spaced apart from each other.

The groove G is concave in a direction of a thickness of multiple layers including inorganic insulating layers, and a bottom surface of the groove G may be an upper surface of the second base layer 103 constituting the substrate 100.

In addition, the plurality of protruding tips PT1 to PT3 protrude from a side of the groove G toward inside of the groove G. The first protruding tip P1 is a protruding tip located in a top part of the side of the groove G. The first protruding tip PT1 may be provided as a part of the second layer 207b of the second insulating interlayer 207. The second protruding tip PT2 is arranged below the first protruding tip PT1 to be separate from the first protruding tip PT1, and may be provided as a part of the first insulating interlayer 205. The third protruding tip PT3 may be arranged below the second protruding tip PT2 to be separate from the second protruding tip PT2, and may be provided as a part of the first buffer layer 201a.

The first to third protruding tips PT1 to PT3 may include a material having a small etching rate. An insulating layer between the first protruding tip PT1 and the second protruding tip PT2, an insulating layer between the second protruding tip PT2 and the third protruding tip PT3, and an insulating layer below the third protruding tip PT3 may include a material having a great etching rate.

In some exemplary embodiments, the first to third protruding tips PT1 to PT3 may include SiNx, for example. In an exemplary embodiment, the insulating layers between the first to third protruding tips PT1 to PT3 may include SiOx, for example.

In an exemplary embodiment, the length L for which the first to third protruding tips PT1 to PT3 protrude from the side of the groove G may be about 100 nm to about 600 nm, for example.

The thickness t1 of the first protruding tip PT1 may be greater than the thickness t2 of the second protruding tip PT2. The thickness t2 of the second protruding tip PT2 may be greater than the thickness t3 of the third protruding tip PT3 (i.e., t1>t2>t3). In an exemplary embodiment, the thickness t1 of the first protruding tip PT1 may be about 2000 Å, for example. In an exemplary embodiment, the thickness t2 of the second protruding tip PT2 may be about 1500 Å, for example. In an exemplary embodiment, the thickness of the third protruding tip PT3 may be about 500 Å, for example. The thicknesses t1, t2, and t3 may have values derived by taking into account characteristics of members in the display area DA, the thin-film transistor TFT, and the storage capacitor Cst at same time.

In the illustrated exemplary embodiment, the respective thicknesses t1, t2, and t3 of a plurality of the first to third protruding tips PT1 to PT3 may not be constant. In an exemplary embodiment, the thicknesses of the first to third protruding tips PT1 to PT3 may become small in a direction of the center line CP inside the groove G, for example. In an alternative exemplary embodiment, ends of the first to third protruding tips PT1 to PT3 may be sharp.

Shapes of the first to third protruding tips PT1 to PT2 may be variously modified according to an etching condition.

Figure 12:
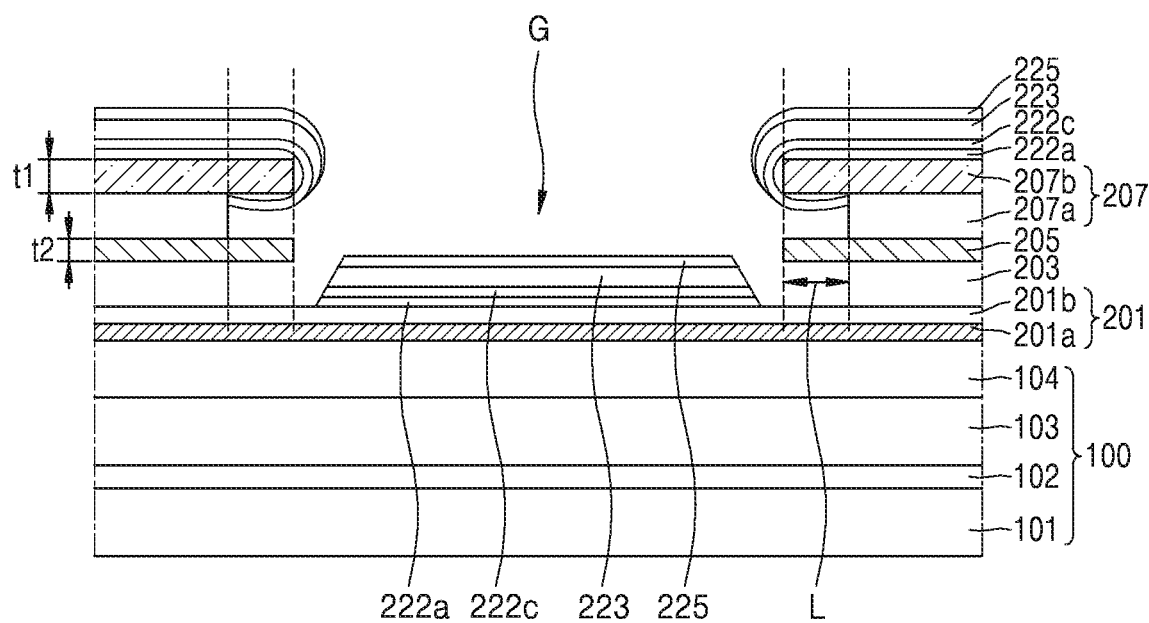
FIG. 12 is a cross-sectional view of another exemplary embodiment of a part of a display panel.

FIG. 12 is a cross-sectional view of another exemplary embodiment of a part of a display panel. FIG. 12 shows an area in which the groove G is arranged. Like numeral in FIGS. 9 and 12 denote like members, and thus, a description thereof will not be provided here again.

In the illustrated exemplary embodiment, the display panel includes the groove G between the opening area OA and the display area DA. The groove G includes the plurality of protruding tips PT1 and PT2 having different heights from an upper surface of the substrate 100 and space apart from each other.

In the illustrated exemplary embodiment, the groove G is concave in a direction of a thickness of multiple layers including inorganic insulating layers, and a bottom surface of the groove G may be an upper surface of the buffer layer 201.

Accordingly, two protruding tips including the first protruding tip PT1 and the second protruding tip PT2 may be arranged in the groove G.

In addition, the plurality of protruding tips PT1 and PT2 protrude from a side of the groove G toward inside of the groove G. The first protruding tip P1 is a protruding tip located in a top part of the side of the groove G. The first protruding tip PT1 may be provided as a part of the second layer 207b of the second insulating interlayer 207. The second protruding tip PT2 is arranged below the first protruding tip PT1 to be separate from the first protruding tip PT1, and may be provided as a part of the first insulating interlayer 205.

The first and second protruding tips PT1 and PT2 may include a material having a small etching rate. An insulating layer between the first protruding tip PT1 and the second protruding tip PT2 and an insulating layer below the second protruding tip PT2 may include a material having a great etching rate.

In some exemplary embodiments, the first and second protruding tips PT1 and PT2 may include SiNx, for example. In an exemplary embodiment, the insulating layer between the first and second protruding tips PT1 and PT3 may include SiOx, for example.

In an exemplary embodiment, the length L for which the first and second protruding tips PT1 and PT2 protrude from the side of the groove G may be about 100 nm to about 600 nm, for example. In an exemplary embodiment, when the length L for which the first and second protruding tips PT1 and PT2 protrude is about 100 nm or greater, for example, organic layers may be effectively disconnected. When the length L is about 600 nm or greater, a condition for a process may not be ensured.

The thickness t1 of the first protruding tip PT1 may be greater than the thickness t2 of the second protruding tip PT2 (i.e., t1>t2). In an exemplary embodiment, the thickness t1 of the first protruding tip PT1 may be about 2000 Å, for example. In an exemplary embodiment, the thickness t2 of the second protruding tip PT2 may be about 1500 Å, for example. The thicknesses t1 and t2 may have values derived by taking into account characteristics of members in the display area DA, the thin-film transistor TFT, and the storage capacitor Cst at same time.

In the illustrated exemplary embodiment, since a depth of the groove G is less than that of the groove G of FIG. 7, a time period for performing an etching process may be reduced. Even when a depth of the groove G is small, since a plurality of the protruding tips PT1 and PT2 are included in the groove G, the parts of the intermediate layer 222 (the first and second functional layers 222a and 222c), the opposite electrode 223, and the capping layer 225 may be disconnected.

Figure 13:
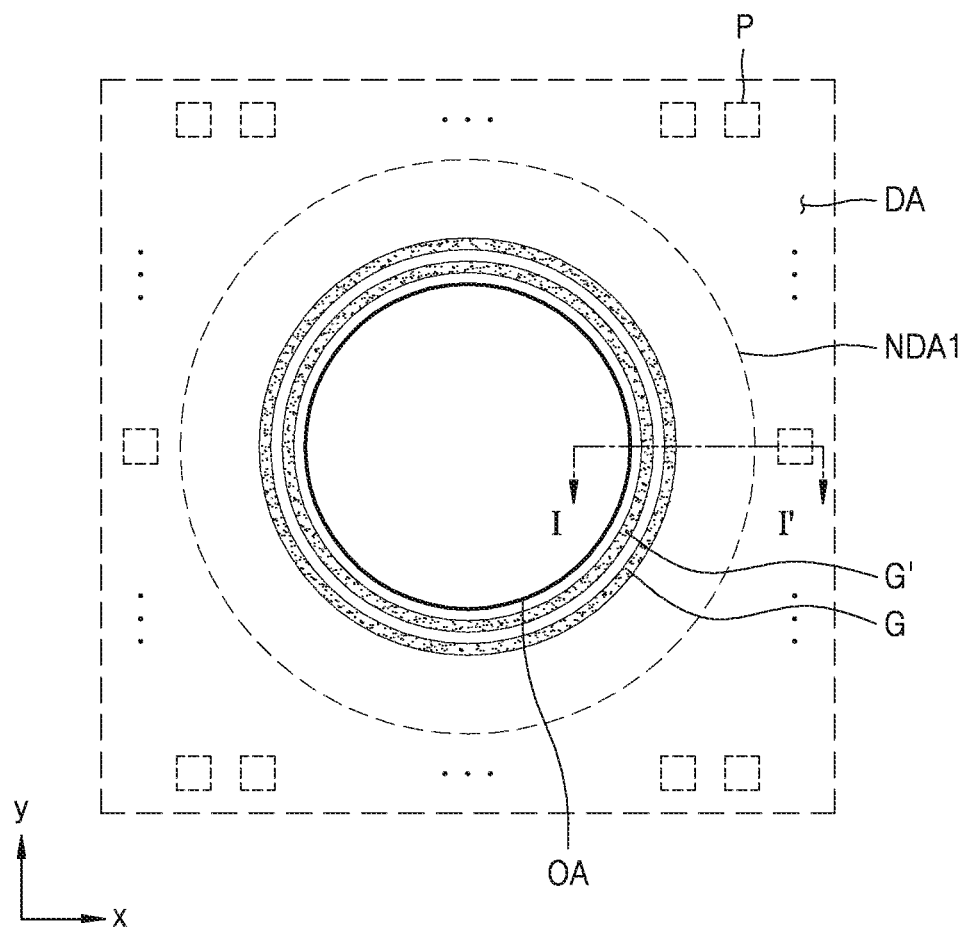
FIG. 13 is a plan view of another exemplary embodiment of a part of a display panel.
Figure 14:
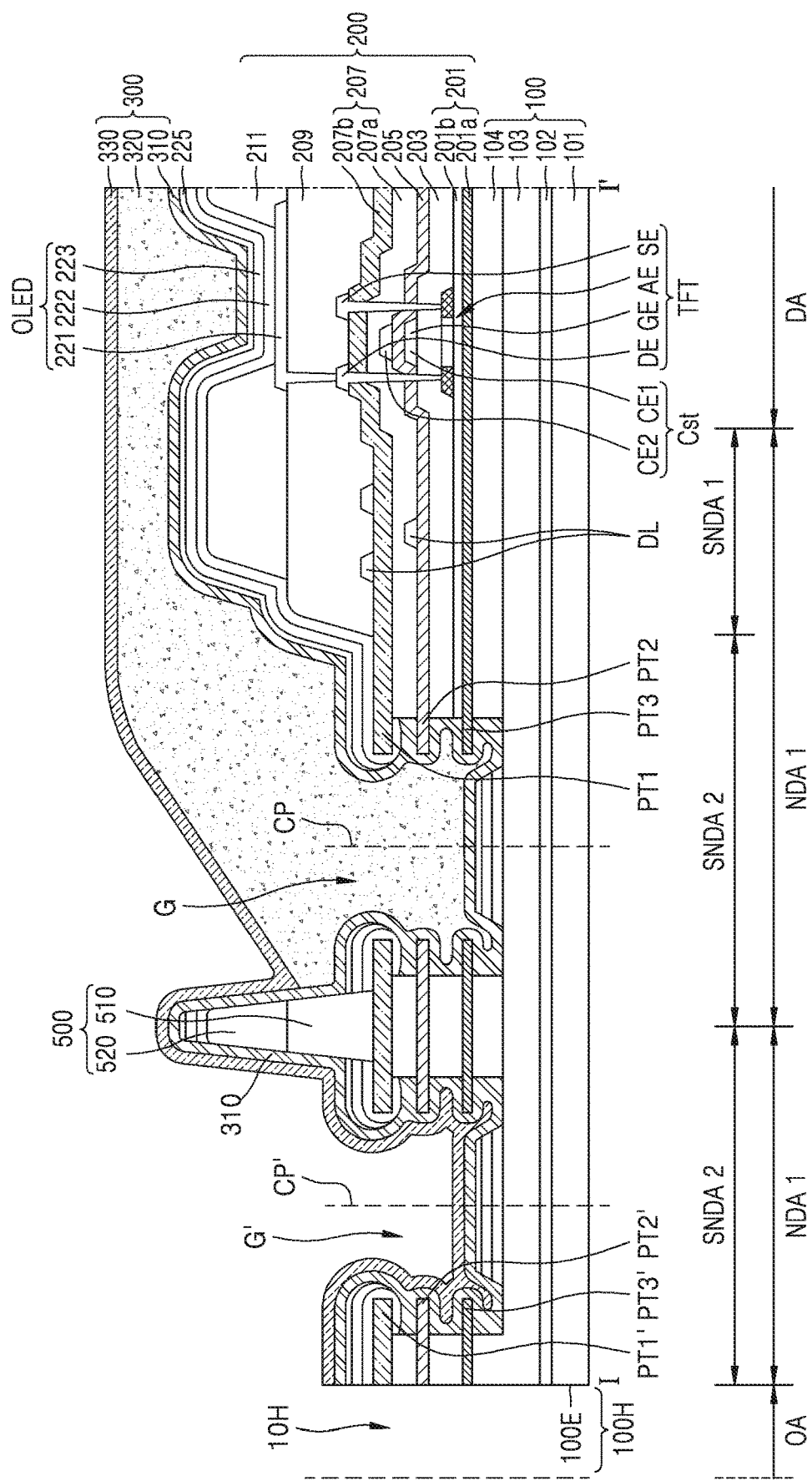
FIG. 14 is a cross-sectional view of another exemplary embodiment of a part of a display panel.

FIGS. 13 and 14 are a plan view and a cross-sectional view of another exemplary embodiment of a part of a display panel. In FIGS. 13 and 14, same numerals as those in FIGS. 9 and 11 denote same members as those in FIGS. 9 and 11. Thus, a description thereof will not be provided here again.

Referring to FIGS. 13 and 14, the display panel in the illustrated exemplary embodiment may include a plurality of grooves G and G'.

Referring to FIG. 13, it is shown that the groove G and the additional groove G' are arranged between the opening area OA and the display area DA. In another exemplary embodiment, three or more grooves may be arranged in the first non-display area NDA1.

The additional groove G' may be arranged between the opening area OA and the groove G, and have a shape of a ring surrounding the whole opening area OA. A diameter of the groove G may be greater than that of the additional groove G' to surround the additional groove G'.

FIG. 13 shows that a width of the groove G is same as a width of the additional groove G'. However, the width of the groove G may be different from the width of the additional groove G'.

Referring to FIG. 14, first to third protruding tips PT1', PT2', and PT3' may be arranged at a side of the additional groove G'. The first to third protruding tips PT1', PT2', and PT3' may protrude from the side of the additional groove G' toward an inside of the additional groove G'. In an alternative exemplary embodiment, a first to third protruding tips PT1', PT2', and PT3' may protrude from a side of the additional groove G' toward the center line CP' extending in a direction perpendicular to an upper surface of the substrate 100.

The first protruding tip PT1' is a protruding tip located in a top part of a side of the additional groove G'. The first protruding tip PT1' may be provided as a part of the second layer 207b of the second insulating interlayer 207.

The second protruding tip PT2' is arranged below the first protruding tip PT1' to be separate from the first protruding tip PT1', and may be provided as a part of the first insulating interlayer 205.

The third protruding tip PT3' may arranged below the second protruding tip PT2' to be separate from the second protruding tip PT2', and may be provided as a part of the first buffer layer 201a.

The first to third protruding tips PT1' to PT3' may include a material having a small etching rate. An insulating layer between the first protruding tip PT1' and the second protruding tip PT2', an insulating layer between the second protruding tip PT2' and the third protruding tip PT3', and an insulating layer below the third protruding tip PT3' may include a material having a great etching rate.

In some exemplary embodiments, the first to third protruding tips PT1' to PT3' may include SiNx, for example. In an exemplary embodiment, the insulating layers between the first to third protruding tips PT1' to PT3' may include SiOx, for example.

A partition wall 500 may be arranged between the groove G and the additional groove G'. The partition wall 500 may include an organic insulating material. In an exemplary embodiment, the partition wall 500 may have a structure in which first and second sub-wall portions 510 and 520 are stacked, for example.

The partition wall 500 may be arranged to control flow of a monomer and ensure a thickness of the monomer when the organic encapsulation layer 320 of the thin-film encapsulation layer 300 is provided.

The first sub-wall portion 510 may include a same material as that of the organic insulating layer 209 and may be provided at the same time as the organic insulating layer 209. The second sub-wall portion 520 may include a same material as that of the pixel-defining layer 211 and may be provided at the same time as the pixel-defining layer 211.

In an area between the additional groove G' and the opening area OA, the first inorganic encapsulation layer 310 is arranged to directly contact the second inorganic encapsulation layer 330 not to expose the organic encapsulation layer 320. Accordingly, external air may not be transmitted to the display area DA via the opening area OA.

In addition, since organic layers like the parts of the intermediate layer 222, the capping layer 225, etc., are disconnected by the groove G and the additional groove G', moisture penetration due to the organic layers may be prevented.

In exemplary embodiments of a display apparatus, penetration of moisture into a display element, etc., may be prevented by defining a groove in a non-display area, and organic layers may be efficiently disconnected by forming a plurality of protruding tips in a direction toward an inside of the groove.

However, such an effect is only an example, and effects in exemplary embodiments will be provided in detail in the description provided herein.

It should be understood that embodiments described herein should be considered in a descriptive sense only and not for purposes of limitation. Descriptions of features within each exemplary embodiment should typically be considered as available for other similar features in other exemplary embodiments.

While one or more embodiments have been described with reference to the drawing figures, it will be understood by those of ordinary skill in the art that various changes in form and details may be made therein without departing from the spirit and scope as defined by the following claims.

What is claimed is:

1. A display panel comprising:
a substrate comprising an opening area and a display area surrounding the opening area;
a plurality of display elements in the display area; and
a groove arranged between the opening area and the display area and including a first protruding tip and a second protruding tip having different heights from an upper surface of the substrate and spaced apart from each other,
wherein the first protruding tip and the second protruding tip protrude from a side of the groove toward an inside of the groove.

2. The display panel of claim 1, wherein each of the first protruding tip and the second protruding tip is consecutively arranged along the side of the groove.

3. The display panel claim 1, further comprising inorganic layers comprising a plurality of first inorganic material layers, and a plurality of second inorganic material layers arranged between the plurality of first inorganic material layers and having an etching rate greater than that of the plurality of first inorganic material layers, and
the groove is concave in a direction of a thickness of the inorganic layers.

4. The display panel of claim 3, wherein the first protruding tip and the second protruding tip include the plurality of first inorganic material layers.

5. The display panel of claim 3, wherein the plurality of first inorganic materials comprise silicon nitride (SiNx), and the plurality of second inorganic material layers comprise silicon oxide (SiOx).

6. The display panel of claim 1, further comprising:
a thin-film transistor arranged in the display area and comprising a semiconductor layer, a gate electrode, a source electrode, and a drain electrode; and
a first insulating interlayer, a first layer of a second insulating interlayer, and a second layer of the second insulating interlayer which are sequentially arranged between the gate electrode and the source electrode,
wherein the first protruding tip is a part of the second layer of the second insulating interlayer, and the second protruding tip is a part of the first insulating interlayer.

7. The display panel of claim 6, further comprising a storage capacitor comprising a first electrode in the display area and in a same layer as a layer of the gate electrode of the thin-film transistor, and a second electrode on the first insulating interlayer.

8. The display panel of claim 1, wherein a third protruding tip is further arranged at the side of the groove and spaced apart from the first protruding tip and the second protruding tip.

9. The display panel of claim 8, wherein the substrate comprises a first base layer, a first inorganic layer, a second base layer, and a second inorganic layer which are sequentially stacked,
a bottom surface of the groove is an upper surface of the second base layer, and
the third protruding tip is provided by extending a buffer layer on the second inorganic layer.

10. The display panel of claim 1, further comprising a thin-film encapsulation layer covering the plurality of display elements and comprising a first inorganic encapsulation layer, an organic encapsulation layer, and a second inorganic encapsulation layer which are sequentially stacked,
wherein the organic encapsulation layer fills at least a part of the groove.

11. The display panel of claim 10, wherein the first inorganic encapsulation layer contacts the second inorganic encapsulation layer in an area between the opening area and the groove.

12. The display panel of claim 1, wherein a thickness of at least one of the first protruding tip and the second protruding tip decreases in a direction toward the inside of the groove.

13. The display panel of claim 1, further comprising:
a buffer layer on the substrate; and
a thin-film transistor on the buffer layer in the display area,
wherein a bottom surface of the groove is an upper surface of the buffer layer.

14. The display panel of claim 1, further comprising:
an additional groove between the groove and the opening area; and a partition wall arranged between the groove and the additional groove and comprising an inorganic material.

15. A display panel comprising:
a substrate in which an opening is defined;
display elements in a display area surrounding at least a part of the opening;
a thin-film encapsulation layer arranged on the display elements and comprising a first inorganic encapsulation layer, an organic encapsulation layer, and a second inorganic encapsulation layer; and
a groove between the opening and the display area,
wherein the groove is concave in a direction of a thickness of layers comprising a plurality of first inorganic material layers and a plurality of second inorganic material layers, and a plurality of protruding tips are arranged on a side of the groove and at heights different from each other.

16. The display panel of claim 15, wherein the plurality of first inorganic material layers comprises silicon nitride (SiNx), the plurality of second inorganic material layers comprises silicon oxide (SiOx), and the plurality of protruding tips is parts of the plurality of first inorganic material layers.

17. The display panel of claim 15, further comprising:
a thin-film transistor arranged in the display area and comprising a semiconductor layer, a gate electrode, a source electrode, and a drain electrode; and
a first insulating interlayer, a first layer of a second insulating interlayer, and a second layer of the second insulating interlayer which are sequentially arranged between the gate electrode and the source electrode,
wherein a first protruding tip is a part of the second layer of the second insulating interlayer, and a second protruding tip is a part of the first insulating interlayer.

18. The display panel of claim 15, wherein a thickness of at least one of the plurality of protruding tips decreases in a direction toward an inside of the groove.

19. The display panel of claim 15, further comprising:
a buffer layer on the substrate; and
a thin-film transistor on the buffer layer in the display area,
wherein a bottom surface of the groove is an upper surface of the buffer layer.

20. The display panel of claim 15, further comprising:
an additional groove between the groove and an opening area; and
a partition wall arranged between the groove and the additional groove and comprising an organic material.

* * * * *